US006324904B1

(12) United States Patent
Ishikawa et al.

(10) Patent No.: US 6,324,904 B1
(45) Date of Patent: Dec. 4, 2001

(54) MINIATURE PUMP-THROUGH SENSOR MODULES

(75) Inventors: Akira Ishikawa, Royse City; Nabuo Takeda, Richardson; Suzanne I. Ahn; Steven R. Hays, both of Dallas, all of TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/641,480

(22) Filed: Aug. 18, 2000

Related U.S. Application Data
(60) Provisional application No. 60/149,799, filed on Aug. 19, 1999.

(51) Int. Cl.[7] ............................. F21B 47/12; F21B 47/10; F21B 45/00
(52) U.S. Cl. .................................. 73/152.03; 73/152.31; 73/152.45
(58) Field of Search ................................................ 73/152

(56) References Cited

U.S. PATENT DOCUMENTS

| 3,944,982 | 3/1976 | Mogi et al. ...................... 340/171 R |
|---|---|---|
| 4,050,313 | 9/1977 | Shimada et al. ....................... 73/398 |
| 4,333,072 | 6/1982 | Beigel ............................. 340/825.54 |
| 4,618,844 | 10/1986 | Takahashi et al. ....................... 338/2 |
| 4,665,610 | 5/1987 | Barth ....................................... 29/580 |
| 4,754,314 | 6/1988 | Scott et al. ............................. 357/42 |
| 5,154,514 | 10/1992 | Gambino et al. ..................... 374/178 |
| 5,492,017 | 2/1996 | Jennings et al. ....................... 73/728 |
| 5,656,512 | 8/1997 | Beitman .................................. 438/52 |
| 5,814,280 | 9/1998 | Tomita et al. ..................... 422/82.01 |
| 5,821,599 | 10/1998 | Rupp ..................................... 257/467 |
| 5,877,943 | 3/1999 | Ramamurthi ......................... 361/783 |
| 5,955,776 | 9/1999 | Ishikawa .............................. 257/618 |

FOREIGN PATENT DOCUMENTS

WO 98/25090  6/1998  (WO) .

Primary Examiner—Daniel S. Larkin
Assistant Examiner—Jay L. Politzer
(74) Attorney, Agent, or Firm—Howison, Chauza, Thoma, Handley & Arnott, L.L.P.

(57) ABSTRACT

Sensor modules are provided which are pumped into a well by first being pumped downhole within a drill string, then passing through the drill bit and being circulated uphole in the annulus between the drill string and the borehole of the well. The sensors take measurement readings as they are being pumped uphole through the annulus. The sensors are preferably separated from the mud returns from the well, and then read at an inductive read unit. The sensor modules are provided by semiconductor substrates which measure downhole well parameters, and then store the date for retrieval at the surface. The semiconductor substrates preferably have a plurality of sides on which measurement sensors and circuitry may be formed, allowing the circuitry and the sensors to be made of smaller sizes. Such sensors include temperature sensors, three-dimensional stain gauges, which are also useful as pressure transducers, inductive pressure transducers, inclination sensors, accelerometers, gyroscopes and radiation detectors. The sensors and circuitry are preferably provided on spherically shaped semiconductor substrates.

9 Claims, 20 Drawing Sheets

MINIATURE PUMP-THROUGH SENSOR MODULES

CROSS-REFERENCE TO RELATED APPLICATIONS

This application claims priority under 35 U.S.C. § 119 (e) from U.S. Provisional application Serial No. 60/149,799 entitled "MINIATURE PUMP-THROUGH SENSOR MODULES" and filed Aug. 19, 1999, and is related to the U.S. Pat. No. 5,955,776 entitled "SPHERICAL-SHAPED SEMICONDUCTOR INTEGRATED CIRCUIT" which issued Sep. 21, 1999, U.S. Provisional application Serial No. 06/163,656 entitled "MEDICALLY IMPLANTED ACCELEROMETERS" filed Nov. 3, 1999; and the following pending U.S. patent applications: Ser. No. 09/448,781 entitled "SPHERICALLY-SHAPED BIOMEDICAL IC" filed Nov. 24, 1999; and Ser. No. 09/448,642 entitled "MINIATURE SPHERICAL-SHAPED SEMICONDUCTOR WITH TRANSDUCER" filed Nov. 24,1999.

TECHNICAL FIELD OF THE INVENTION

The present invention relates in general to measurement tools and measurement sensors, and in particular to sensor modules and well logging tool sensors formed of solid state semiconductors which are pumped through a region in which measurements are to be taken.

BACKGROUND OF THE INVENTION

Prior art measurement sensors have been used for measuring parameters of both piping and geological systems. In piping systems, there is often a need to determine where potential problems exist prior to catastrophic failure. Prior art measurement sensors have been used in piping systems to monitor and inspect the conditions of piping systems, and to measure the parameters of and properties of fluids flow through such systems. There is also a need to monitor the flow of fluids, and the composition of such fluids in production and fluid treatment systems, which range from food processing plants and waste treatment facilities, to refineries and chemical plants. It is also desirable to measure other process parameters, such as the concentrations of chemicals and other elements used in processing and treatment operations.

In oil field exploration and production operations, measurement sensors and such devices have been used for determining the constituents of geological formations, including the types of fluids in such formations. Prior art measurement sensors have also been used for determining downhole well conditions. The measurement sensors have been packaged in well logging tools, some of which are included in drill strings, such as those known as Measurement While Drilling ("MWD") tools in which drill strings are used for both running the measurement sensors in to the wells and retrieving the sensors from the well. Other tools have been run downhole within wells and retrieved from wells on other conveyance means, such as wireline, slickline, coiled tubing and production tubing. Planar semiconductor devices and sensors of various types have been used in these types of prior art logging tools. Operations for running such tools into and later retrieval from wells often requires additional time for such operations. Such tools are subject to frequent failures, which often necessitate removal of the failed tools from within wells for replacement with operational logging tools, which requires the removal of the conveyance device, such as removal of the entire drill string, wireline, slickline or tubing.

SUMMARY OF THE INVENTION

The present invention disclosed and claimed herein, in one aspect thereof, is directed toward sensor modules which are circulated through a well by first being pumped downhole within a drill string, and passing through the drill bit and being circulated uphole in the annulus between the drill string and the borehole of the well. The sensor modules take measurement readings at they are pumped uphole through the annulus. The sensor modules are preferably separated from the mud returns from the well, and then read at an inductive read unit. The sensor modules are provided by semiconductor substrates which measure downhole well parameters, and then store the date for retrieval at the surface. The semiconductor substrates preferably have a plurality of sides on which measurement sensors and circuitry may be formed, allowing the circuitry and the sensors to be made of smaller sizes. Such sensors include temperature sensors, three-dimensional strain gauges, which are also useful as pressure transducers, inductive pressure transducers, inclination sensors, accelerometers, gyroscopes, magnetometers and radiation detectors. The sensors and circuitry are preferably provided on spherically shaped, semiconductor substrates.

In yet another aspect of the invention, some types of the pump through sensor modules are activated to take measurement readings when accelerated through the drill bits. Such pump through sensor modules include an accelerometer and are maintained in a stand-by power mode until the high accelerations of passing through the drill bits are detected, which energizes the pump through sensor module into a logging mode.

In another aspect of the present invention, some types of the pump through sensor modules are passive, and energized to read data only when exposed to an electromagnetic field. A turbine generator and inductor coil are included in the drilling tool string in close proximity to the drill bit to activate the pump through sensor modules for taking downhole measurements and storing the measurements in memory.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
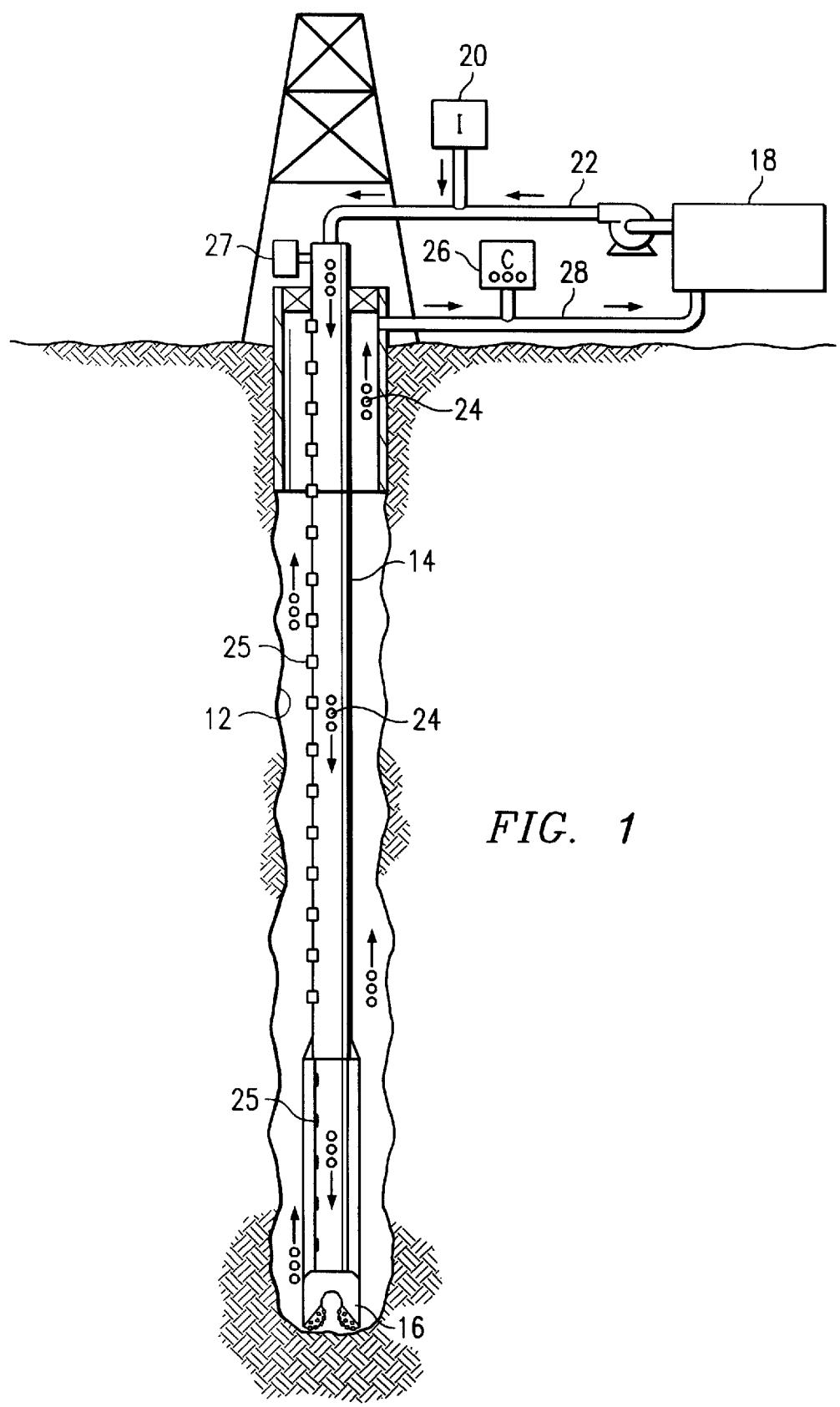
FIG. 1 illustrates a diagrammatic view of use of miniature pump through sensor modules to measure well parameters according to the present invention.

Referring now to FIG. 1, there is illustrated a diagrammatic view of a well 12 having a drill string 14 and drill bit 16 disposed therein. A mud unit 18 provides drilling fluids for circulating drilling fluids downhole through the drill string 14 and the drill bit 16, and then uphole through the annulus between the well 12 and the drill string 14. A flow line 22 is connected between the mud unit 18 and the drill string 14. An injector unit 20 is connected to the flow line 22 for injecting miniature, pump-through well sensor modules 24 into the flow line 22 for pumping downhole within the drill string 14. The sensor modules 24 will be pumped through the drill string 14 and the drill bit 16, and then return uphole through the annulus between the borehole of the well 12 and the drill string 14. A collection unit 26 is provided in a return flow line 28 extending between the well 12 and the mud unit 18. The sensor modules 24 are separated from the returning drilling fluids and collected in a collection unit 26, in which the data is read from memory storage onboard the sensor modules 24. The data is preferably inductively read from the memory of the sensor modules 24, as described below.

Also included in the drill string 14 are relay modules 25, which are similar in construction to sensor modules 24, and may be identical in construction to the sensor modules described herein, except that the relay modules 25 are preferably mounted to the various components of the drill string 14 at spaced apart intervals. The spaced apart intervals are preferably within the transmit and receive radio frequency range of the relay modules 25, such that data signals may be relayed uphole from the bottom of the drill string 14 to a data collection unit 27 mounted adjacent to an upper one of the relay units 25, above the well 12. The data collection unit 27 will preferably include permanent memory storage and will relay the collected data to a central database. Power for the relay modules 25 may also be relayed downhole from the data collection unit 27, by use of electromagnetic energy, such as that corresponding to radio frequencies. Power may also be relayed by the sensor modules 24, and data from the sensor modules 24 may be transferred to the relay modules 25. Battery power may also be provided as described below for the sensor modules 24. Various sensors, such as those described below for the sensor modules 24, may also be used with the relay modules 25. The sensor modules 24 and the relay modules 25 may have single sensors and memory for recording only a single measurement parameter. Others of the sensor modules 24 and the relay modules 25 may have multiple sensors for measuring multiple parameters, such as the parameters set forth below. Additionally, the sensor modules 24 and the relay modules 25 may have a single storage register for storing only the single reading of the parameters, or a much larger memory array for storing a plurality of the readings of the measurement parameters. Further, different combinations of the above-noted various types of the sensor modules 24 and the relay modules 25 may be used simultaneously. In the following discussion, the relay modules 25 may be of identical or similar construction to that described below for the sensor modules 24.

When pump-through sensor modules 24 are used for data collection and retrieval, several of various types of the pump-through sensor modules 24 are typically pumped downhole at a time. When battery-powered sensor modules 24 are used, which are powered at the surface and then pumped downhole to record the full time they are pumped downhole and then circulated back uphole, the sensor modules 24 will preferably remain powered for a minimum of five to six hours if activated at the surface. If activated downhole, the sensor modules 24 may be provided with power storage sufficient for the sensor modules 24 to remain powered for anywhere from a fraction of a second, to several hours. Preferably, the sensor modules 24 are low cost, and a significant number of the sensor modules 24 are pumped downhole at one time for redundancy. Preferably, the pump-through sensor modules 24 are spherically shaped and approximately one centimeter in diameter, yet may range in size from one millimeter to several centimeters in diameter. The pump-through sensor modules 24 may also be shapes other than spherical.

When the sensor modules 24 are injected into the slurry through the drill bit 16, the sensor modules 24 will be returned to the surface in the slurry. Although illustrated as being read and collected, these sensor modules 24 could merely "float" to the top and be collected in the return slurry. There could also be provided some type of filter for filtering out the sensor modules 24 from the slurry.

Figure 2:
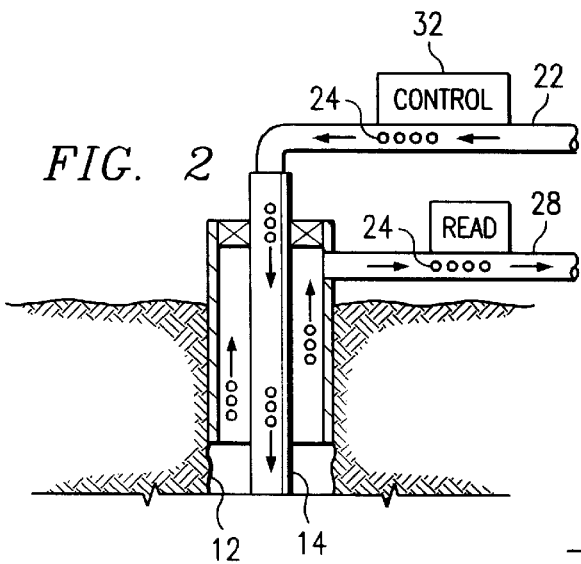
FIG. 2 illustrates a diagrammatic view of control and read units for operating the sensor modules.

Referring now to FIG. 2, there is illustrated a diagrammatic view depicting a first alternative method of operating the pump-through sensor modules 24. A control unit 32 is provided for activating, or turning on, the sensor modules 24 as they are passing through the flow line 22 to the drill string 14. In the return line 28, the sensor modules 24 pass beneath a read unit 34 for reading the data stored in the memory of the sensor modules 24. In this embodiment, the sensor modules 24 are not separated from the return mud flow, but rather are inductively read as they pass beneath the read unit 34, and then recirculated. In some embodiments, the control unit 32 may include recharge coil for recharging an onboard power supply on the sensor modules 24, or a separate charging station may be provided.

Figure 3:
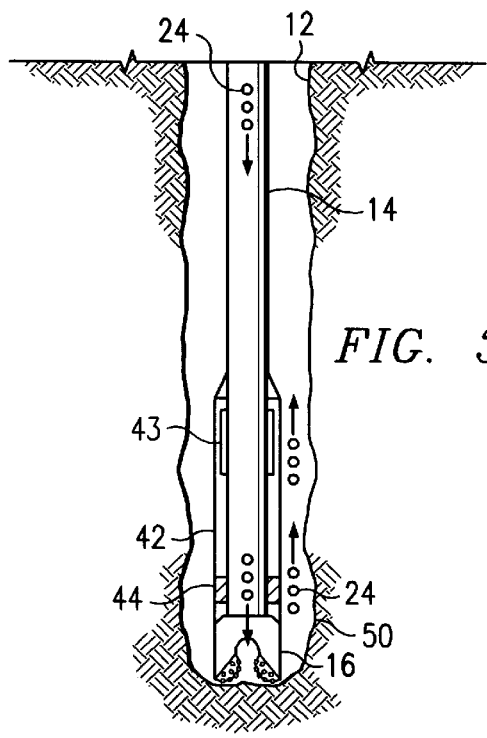
FIG. 3 illustrates a diagrammatic view of a first alternative control unit for activating the sensor modules.

Referring now to FIG. 3, there is illustrated a diagrammatic view of a second alternative method of operating the pump-through sensor modules 24. In this method, the sensor modules 24 are pumped downhole within the drill string 14 in an inactive, or standby state. Mounted to the drill string 14 and the drill bit 16, immediately above the drill bit 16, is a control sub 42 having a control circuit 44 for activating the sensor modules 24. Preferably, the control sub 42 will include a power generator 43, such as a generator turbine which is powered by the mud flowing downhole within the drill string 14. The control circuit 44 is preferably provided by an inductor coil which passes electromagnetic energy to the sensor modules 24 to activate the sensor modules 24 for taking measurements as the sensor modules 24 move uphole with the drilling fluid return. In yet other embodiments, an accelerometer may be included as one of the sensors in the sensor modules 24 to activate the sensor modules as they are pumped through the drill bit 16, which may accelerate the sensor modules to accelerations in excess of fifty G's.

Figure 4:
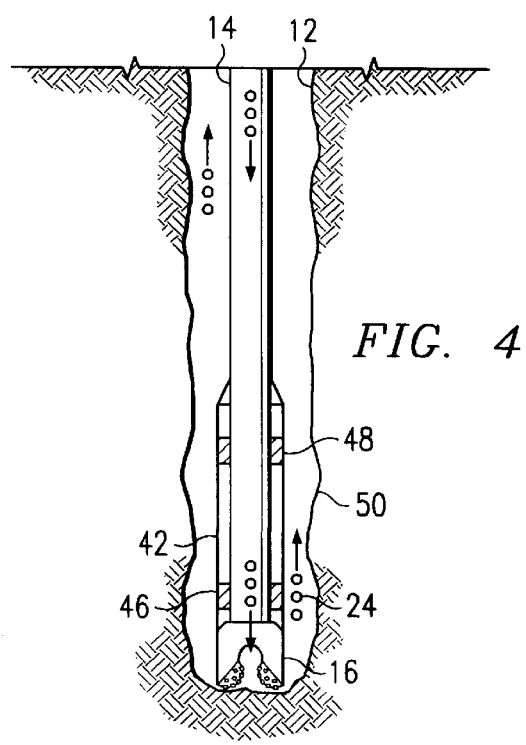
FIG. 4 illustrates a diagrammatic view of second alternative control units for activating the sensor modules.

Referring now to FIG. 4, there is illustrated a diagrammatic view of a well 12 having a drill string 14 and a drill bit 16 disposed therein. The sensor modules 24 are shown within the drill string 14 and after passing from within the drill bit 16. After passing through the drill bit 16, the sensor modules are carried by the drilling fluids uphole and past control units 46 and 48. In the preferred embodiment, the control units 46 and 48 will be mounted to the drill string sub 42, and be electrically powered such that the sensor modules 24 are powered by the control units 46 and 48. In this embodiment, the sensor modules 24 are passive devices, in that they are only powered when passing within an electromagnetic field generated by the control units 46 and 48, which activates the sensor modules 24 for logging a region 50 which is adjacent to the two control units 46 and 48. Once the sensor modules 24 pass beyond the magnetic field emitted by control circuit 48, the sensor modules 24 return to a passive mode and become inactive, such that no more readings are taken. In some embodiments, the sensor modules 24 may have capacitors, or battery storage may be provided, to facilitate power storage for operating the sensor modules 24 for a short period of time after passing the control units 46 and 48. In other embodiments of the sensor modules 24, the control unit 46 may emit a signal to activate the sensor modules 24 to take measurements and store data until the control unit 48 emits a second signal to return the sensor modules 24 to an inactive mode.

Each of the above-noted various types of embodiments of the sensor modules 24 may be used simultaneously, by using a plurality of each of the various types of sensor modules 24. Thus, some of the sensor modules 24 may be of the type which are actively powered for the entire trip downhole and back to the surface, some of the sensor modules 24 may be of the type which are activated for only a short instance when adjacent to one or both of the control units 46 and 48, some of the sensor modules 24 may be of the type which are activated by control unit 46 and then switched to a passive mode by the control unit 48, and others of the sensor modules 24 may be of the type which are activated by an onboard accelerometer which detects the acceleration of when these particular type of the sensor modules 24 pass from through the drill bit 16. In some embodiments, one or both of the control units 47 and 48 may be provided by the sensor modules 24 detecting signals output from conventional MWD tools, such as the sensor modules 24 detecting either the electromagnetic emissions of a tool for reading formation resistivity, the nuclear emissions of a nuclear density tool, the vibrations of a sonic tool, or the like. In some embodiments, a magnetic locator sub having a permanent magnet may be used in the drill string. An accelerometer may also be used to detect when the sensor modules 24 pass through the drill bit 16.

Figure 5:
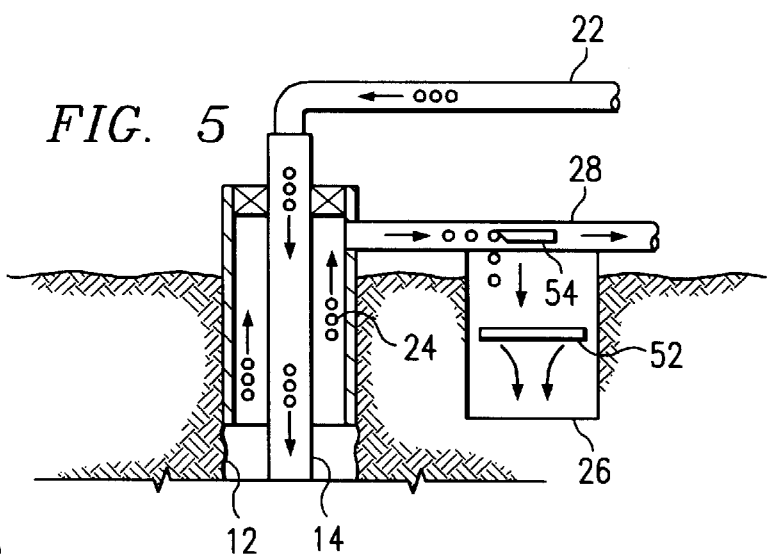
FIG. 5 illustrates a diagrammatic view of a collection unit for collecting and reading the sensor modules.

Referring now to FIG. 5, there is illustrated a diagrammatic view of the collection unit 26 which is disposed in the return flow line 28. The data collection unit 26 includes a collector unit 52, where the various ones of the sensor modules 24 are collected and pass beneath a reader 54. Preferably, the sensor modules 24 are inductively read by passing the sensor modules 24 under reader unit 54 one at a time. The reader unit 54 uses electromagnetic radio signals to initiate retrieval of the data stored in the memory of the sensor modules 24 by return electromagnetic radio signals, as described below.

In an alternate embodiment, each of the sensor modules 24 has associated therewith a clock. When the sensor modules are disposed in the drill string, i.e., inserted, they can be activated or "time-stamped." Once time-stamped, these sensor modules 24 can then have the sensed parameters stored therein when returned in the return slurry such that the time of the sensor measurement can be determined. Since there is an active clock embedded within each of the sensor modules 24, the time from beginning to end can be determined. This is for the purpose of discriminating between sensor modules. Alternatively, each of the sensor modules 24 can have associated therewith an "ID" that can be read out when the sensed information or measured parameters are read out. By inserting the sensor modules 24 into the drill string at a predetermined time correlated with the ID numbers, the sensed parameters can then be associated with the time of entry into the drill string. However, due to the fluid dynamics associated with pumping through the drill string and outward through the borehole, the actual passage of the sensor modules 24 through the drill string and then upward through the borehole could vary such that the sensor modules 24 may actually pass each other in the borehole.

Figure 6:
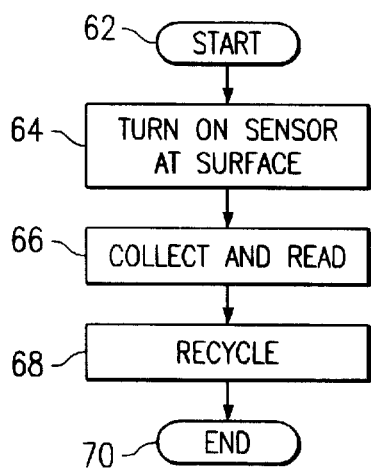
FIG. 6 illustrates a flowchart of operation of the sensor modules.

Referring now to FIG. 6, there is illustrated a flowchart depicting the operation of well logging sensor modules 24 of the type which are battery powered, as depicted in FIGS. 1 and 2. Step 62 depicts the start of the logging operation, in which the sensor modules 24 are injected into the flow line 22. In step 64, the logging sensors 24 are activated, that is, turned on at the surface. In step 66, the sensor modules 24 record data as they travel downhole within the drill string 14 and uphole within the annulus between the well 12 and drill string 16. In step 68, the sensor modules 24 are recycled, which preferably comprises recharging the onboard batteries inductively; that is, recharging the onboard batteries of the sensor modules 24 by use of electromagnetic energy to transfer the battery charging energy, as described below. Step 70 depicts the end of the operation.

Figure 7:
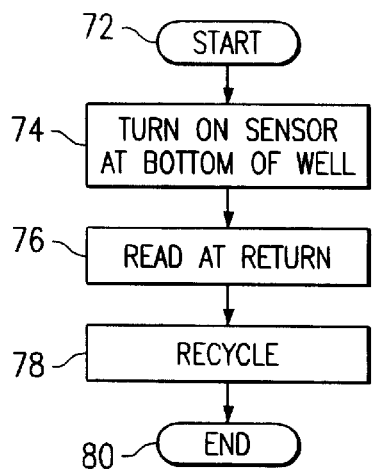
FIG. 7 illustrates a flowchart of operation of the sensor modules according to the first alternative embodiment.

Referring now to FIG. 7, there is illustrated a flowchart depicting operation of the pump-through well sensor modules 24 which are of the type that are turned on at the bottom of the hole, and then operated to record data as the sensor modules 24 pass uphole within the annulus between the borehole of the well 12 and the drill string 14, as depicted in FIG. 3. Operation is begun in the start step 72, by dispensing the sensor modules 24 in the flow line 22, and pumping the sensor modules 24 downhole. Then, in step 74, the sensor modules 24 are activated at the bottom of the well to initiate the recording of detected measurement values. In step 76, the sensor modules 24 record the detected measurement data while being pumped uphole, and then the data values are read from the sensor modules 24 when they return to the surface. In step 78, the sensor modules 24 are recycled by recharging the onboard power storage of the sensor modules 24, as described below. Preferably, previous readings will be written over when the sensor modules 24 are reused. Other sensor modules 24 may be of the type in which the memory for data storage is erased when the sensor modules 24 are recharged, or when erase control signals are detected by various ones of the sensor modules 24. The process ends in step 80.

Figure 8:
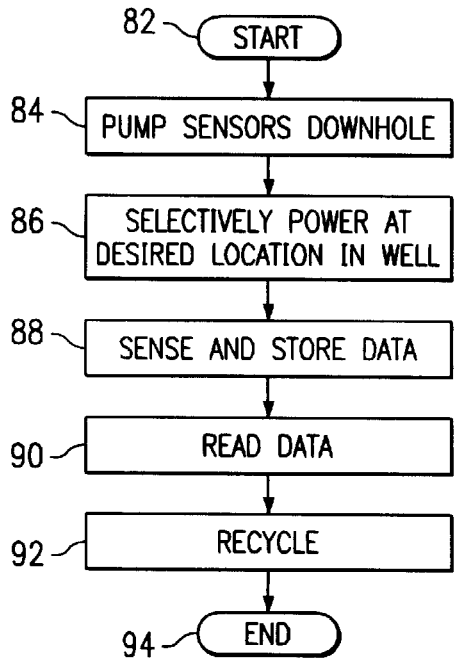
FIG. 8 illustrates a flowchart of operation of the sensor modules according to the second alternative embodiment.

Referring now to FIG. 8, there is illustrated a flowchart depicting the process for operating the sensor modules 24 which are the type that are passive and selectively powered downhole at desired locations, such as that depicted in FIG. 4. The process begins in a Start step 82 in which the sensor modules 24 are injected into the flow line 22. Then, the sensor modules 24 are pumped downhole, in step 84. In step 86, the sensor modules 24 are activated by the control units 46 and 48, depicted in FIG. 4. The sensor modules 24 remain activated to store data in step 88, in the region 50 between the control units 46 and 48. The sensor modules 24 will be recovered in step 90, and the data is retrieved therefrom at the collection unit 26 of FIG. 5. In step 92, the sensor modules 24 are recycled for pumping back downhole. The process ends in step 94.

Figure 9:
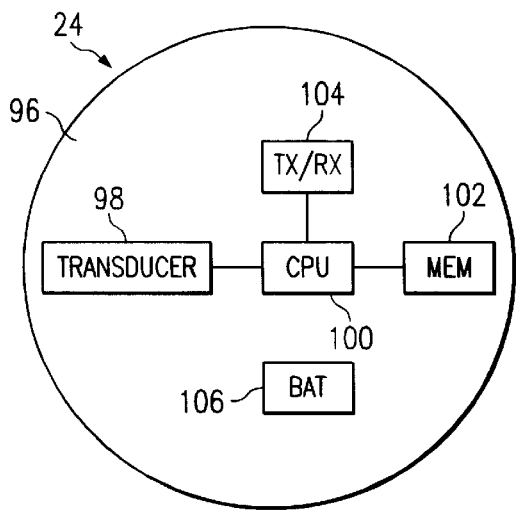
FIG. 9 illustrates a diagrammatic view of one of the sensor modules.

Referring now to FIG. 9, there is illustrated a diagrammatic view showing a sensor module 24. The sensor module 24 is encapsulated in a protective outer covering 96 which preferably is spherically shaped to improve flowability of the sensor modules 24 within the well 12. The sensor module 24 includes a transducer 98 for sensing various well parameters. A memory 102 is provided for storing data. A transmit/receive circuit 104 is provided for receiving control signals and transmitting data stored in the memory 102. A battery 106 is provided for powering the sensor module 24. A CPU 100 connects to the transducer 88 to receive data therefrom, the memory 102 to store data thereinto and receive stored data therefrom, and the transmit/receive circuit 104 to communicate to the external system.

Figure 10:
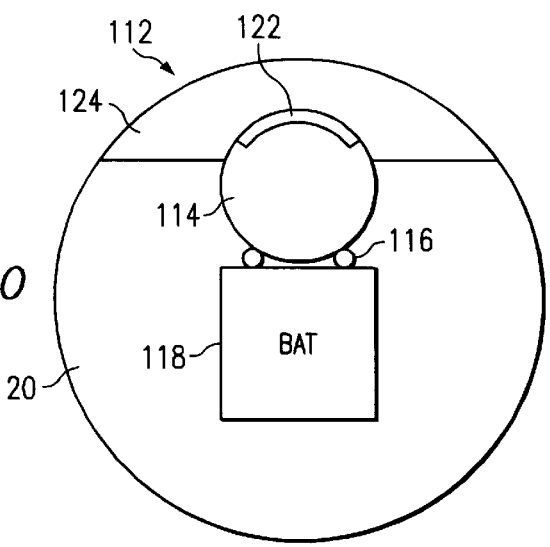
FIG. 10 illustrates a diagrammatic view of an alternative embodiment of the sensor modules.

Referring now to FIG. 10, there is illustrated a pump-through sensor module 112. The sensor module 112 (similar to one of the sensor modules 24) includes a sensor which is formed of a substantially spherical semiconductor substrate 114, and which is mounted to the battery 118 by bump connections 116. The semiconductor 114 and battery 118 are encapsulated within an enclosure 120, preferably provided by material which would be resistant to hostile well environments. The semiconductor 114 includes a transducer surface 122, which is covered by a second protective coating 124. The second protective coating 124 is transmissive to the particular type of parameter being detected by the transducer surface 122.

Figure 11:
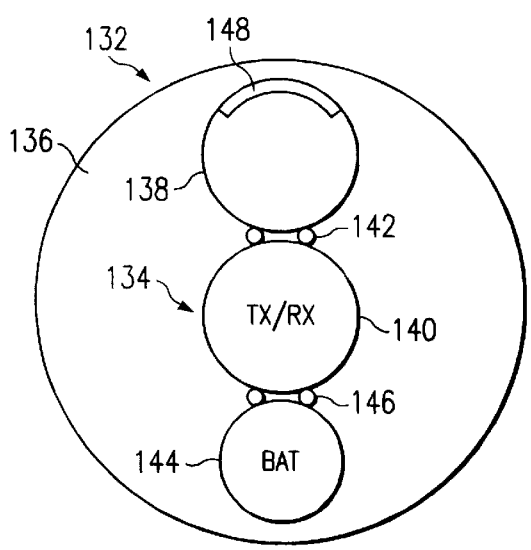
FIG. 11 illustrates a diagrammatic view of another alternative embodiment of the sensor modules.

Referring now to FIG. 11, there is illustrated a pump-through sensor module 132. The sensor module 132 includes components 134 disposed within a protective outer enclosure 136. Preferably, the enclosure 136 is substantially spherical to facilitate pumping of the sensor module 132 through the well 12 of FIG. 1. The components 134 include a sensor section 138, and a transmit and receive section 140. The sensor section 138 is mounted to the transmit/receive section 140 by connector bumps 142. The transmit/receive section 140 is mounted to a battery ball 144 by connector bumps 146. A transducer section 148 is disposed on one side of the sensor section 138.

The battery ball 144 is preferably formed of a substantially spherically-shaped semiconductor substrate, and provides power storage for powering for the sensor module 132. In some embodiments, the battery ball 144 may have inductor windings, or be connected to inductor windings of an adjacent ball, or the like, for receiving power to recharge the ball 144 as described herein. In still other embodiments, the battery ball 144 may be provided by a capacitor bank charged by an inductor coil or a hard-wired connection. The battery ball may also be formed to include a lithium-ion type battery cell. Power cells of other types may also be used to provide the power source of the battery ball 144.

Figure 12:
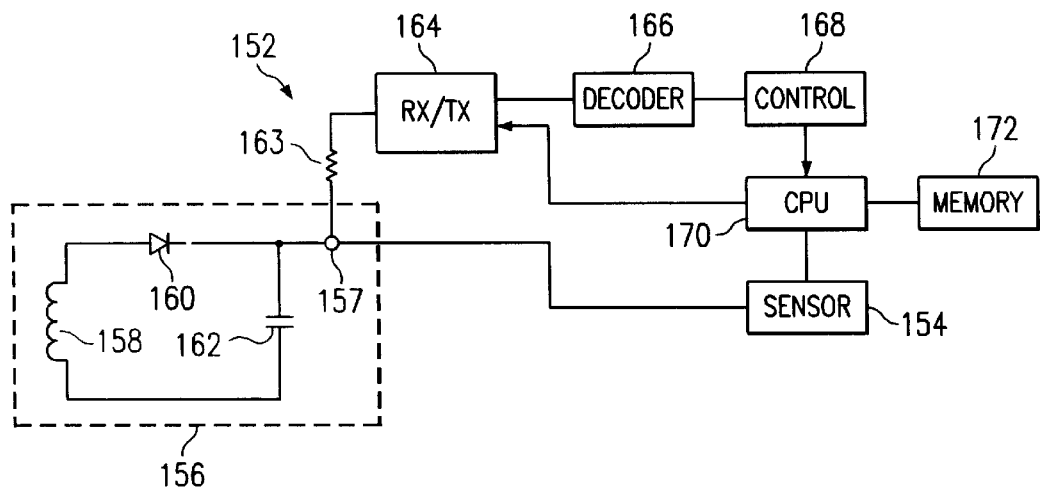
FIG. 12 illustrates a diagrammatic view of a power and control circuit for one of the sensor modules.

Referring now to FIG. 12, there is illustrated a power and control circuit 152 for providing power for operating the sensor modules 24. The circuit 152 includes a power section 156 for providing power to a sensor 154. The power section 156 includes an inductor coil 158, a diode 160, and a capacitor 162. The inductor coil 158 is connected in series with the diode 160. The inductor coil 158 and the diode 160 are connected in parallel with the capacitor 162. The output 157 of the power section 156 is connected to the sensor 154. The output 157 is also connected in series with a resistor 163 and then to a receive and transmit circuit 164. The receive and transmit circuit 164 is connected to a decoder 166 and a CPU 170. The decoder 166 is connected to a control circuit 168. The control circuit 168 is connected to the CPU 170 for sending control signals to the CPU 170 when the decoder 166 detects the control signals on received signals. Connected to the CPU 170 is a memory 172 for data storage. The sensor 154 is connected to the CPU 170. The CPU 170 reads data values from the sensor 154, and then stores the data values in the memory 172.

Figure 13:
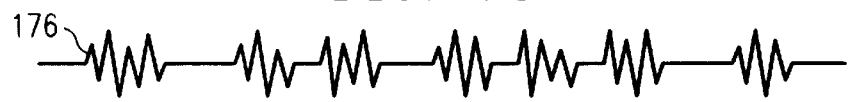
FIG. 13 illustrates a power and control signal for operation of the sensor modules.

Referring now to FIG. 13, there is illustrated a power and control signal waveform 176 used for transmitting power and control information to the sensor module power and control circuit 152. A control signal is encoded in the power and control signal 176, and is decoded by the decoder 166 to control operation of the CPU 170 to operate the sensor 154 and store the data in memory 172. The control signal may be modulated by AM, FM, PM, or any other modulation technique.

Figure 14:
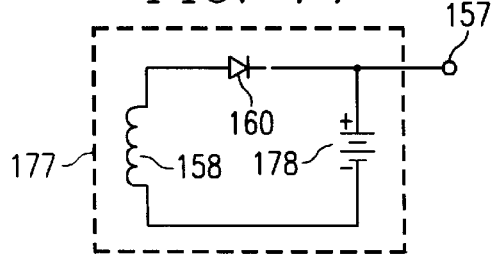
FIG. 14 illustrates a diagrammatic view of an alternative power and control circuit for the sensor modules.

Referring now to FIG. 14, there is illustrated an alternative power circuit 177, which is similar to the power circuit 156 of FIG. 12, except that the capacitor 162 of FIG. 12 is now replaced with a battery 178.

Figure 15:
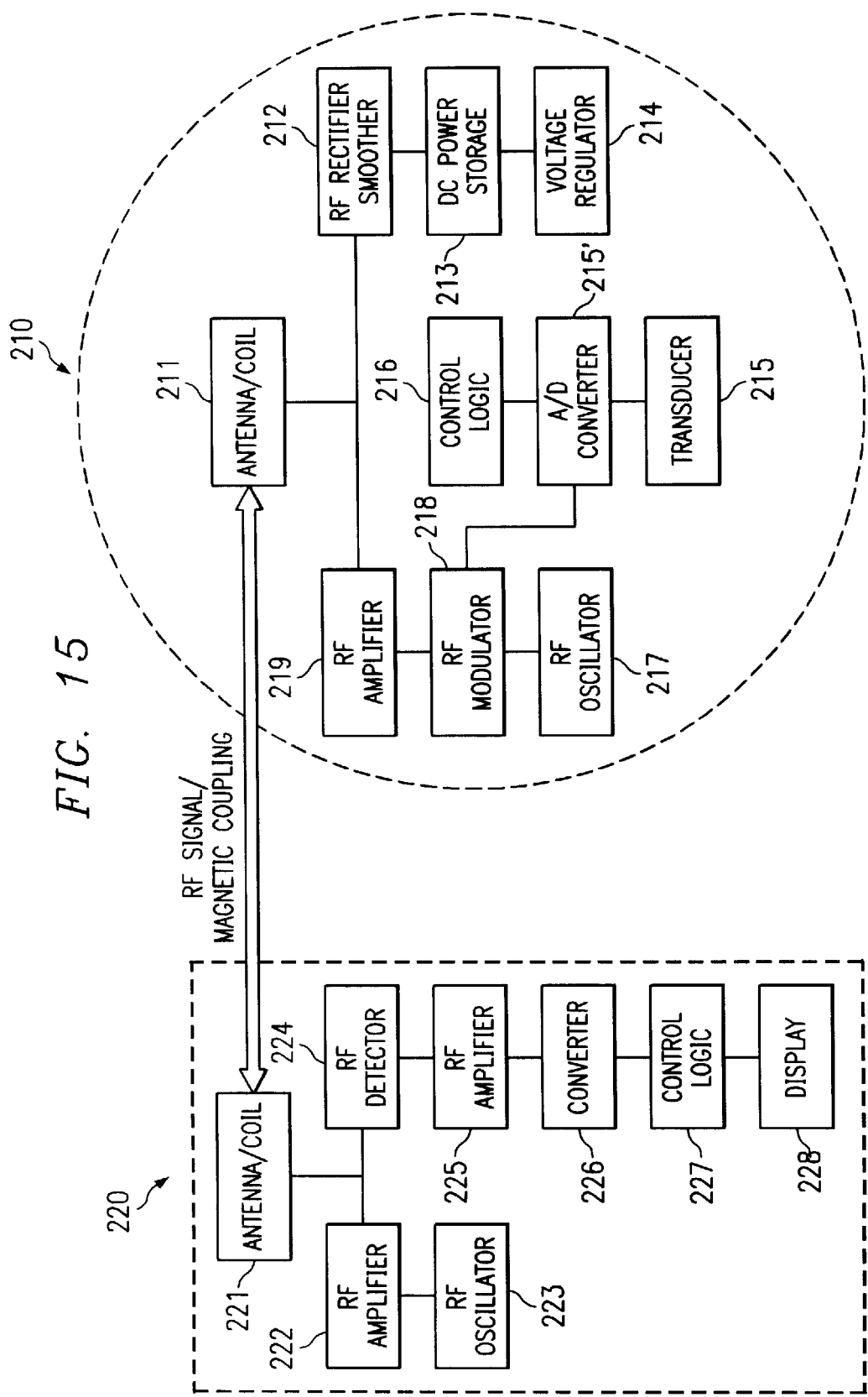
FIG. 15 is a block diagram of a sensor module sphere with an integral transducer in combination with a radio frequency communication system in accordance with the present invention.

Referring now to FIG. 15, the basic circuit functions of a substantially spherical semiconductor substrate 210 of one of the sensor modules 24 are illustrated. Semiconductor substrate 210 includes an antenna/coil 211, which serves the dual purpose of receiving signal energy from a external processing unit 220 and transmitting signal energy thereto. The signal energy may be received by the antenna/coil 211 by inductive coupling if the external processing unit 220 is sufficiently close to the spherical substrate 210. Alternatively, electromagnetic waves can be used to transmit power from the external processing unit 220 to the substrate 210, whereby the magnetic field component of the electromagnetic wave induces a current in the coil 211 in accordance with known techniques. The power signal received by the antenna/coil 211, is rectified and smoothed by a radio frequency (RF) rectifier smoother circuit 212. The output of the smoother circuit 212 is connected to a DC power storage device 213, such as a capacitor. Such capacitor might also perform a waveform smoothing function. A voltage regulator 214 is used to make the DC voltage stable regardless of the distance between the external processing unit 220 and the substrate 210.

An analog-to-digital (A/D) converter 215' is used to convert the electrical signal sensed by the transducer 215' to a signal that can be transmitted out to the external processing unit 220. The converter 215' can be part of the transducer 215, such as a variable capacitor for generating a signal depending upon the variations in capacitance. Control logic 216, which can be part of an onboard processor that controls not only the converter 215', but also circuitry on the sphere 210, is provided in accordance with known techniques.

An RF oscillator 217 generates an RF carrier signal at a predetermined frequency in the RF band. An RF modulator 218 modulates the output of the converter 215' onto the RF carrier signal. The resulting modulated signal is amplified by an RF amplifier 219, and then transmitted to the outside through the antenna/coil 211. Further details of the preferred coil 211 are described in the aforementioned commonly assigned U.S. patent application Ser. No. 09/488,642 filed Nov. 24, 1999, and entitled "Miniature Spherical-Shaped Semiconductor With Transducer," which is hereby incorporated by reference.

The external central processing unit 220 includes an antenna/coil 221 that serves the dual purpose of generating the electromagnetic wave for transmitting power to the substrate 210, and receiving the RF data signal transmitted by the substrate 210. It is preferred that the frequency of the electromagnetic wave that is output by the antenna/coil 221 is different from the carrier frequency generated by the RF oscillator 217. An RF amplifier 222 is used to couple the electromagnetic wave for power transmission to the antenna/coil 221. An RF oscillator 223 determines the frequency of the electromagnetic wave that is emitted by the external processing unit 220. The data received by the antenna/coil 221 is detected by a RF detector 224 and then amplified by an RF amplifier 225. Preferably, a converter 226 converts the signal from the RF amplifier 225 to a digital signal, which in turn is input to a control logic 227. The control logic 227 may be a smaller CPU to interface with the main external processing unit 220. The control logic 227 extracts the data from the signal received by the external processing unit 220 from the substrate 210 and displays that information on a suitable display 228, such as a CRT screen.

The technique for transmitting data from the spherical substrate 210 to the main external processing unit 220 using the carrier frequency generated by the RF oscillator 217 can be in the form using any suitable protocol. The modulation can be AM, FM, PM, or any other suitable modulation technique.

Figure 16:
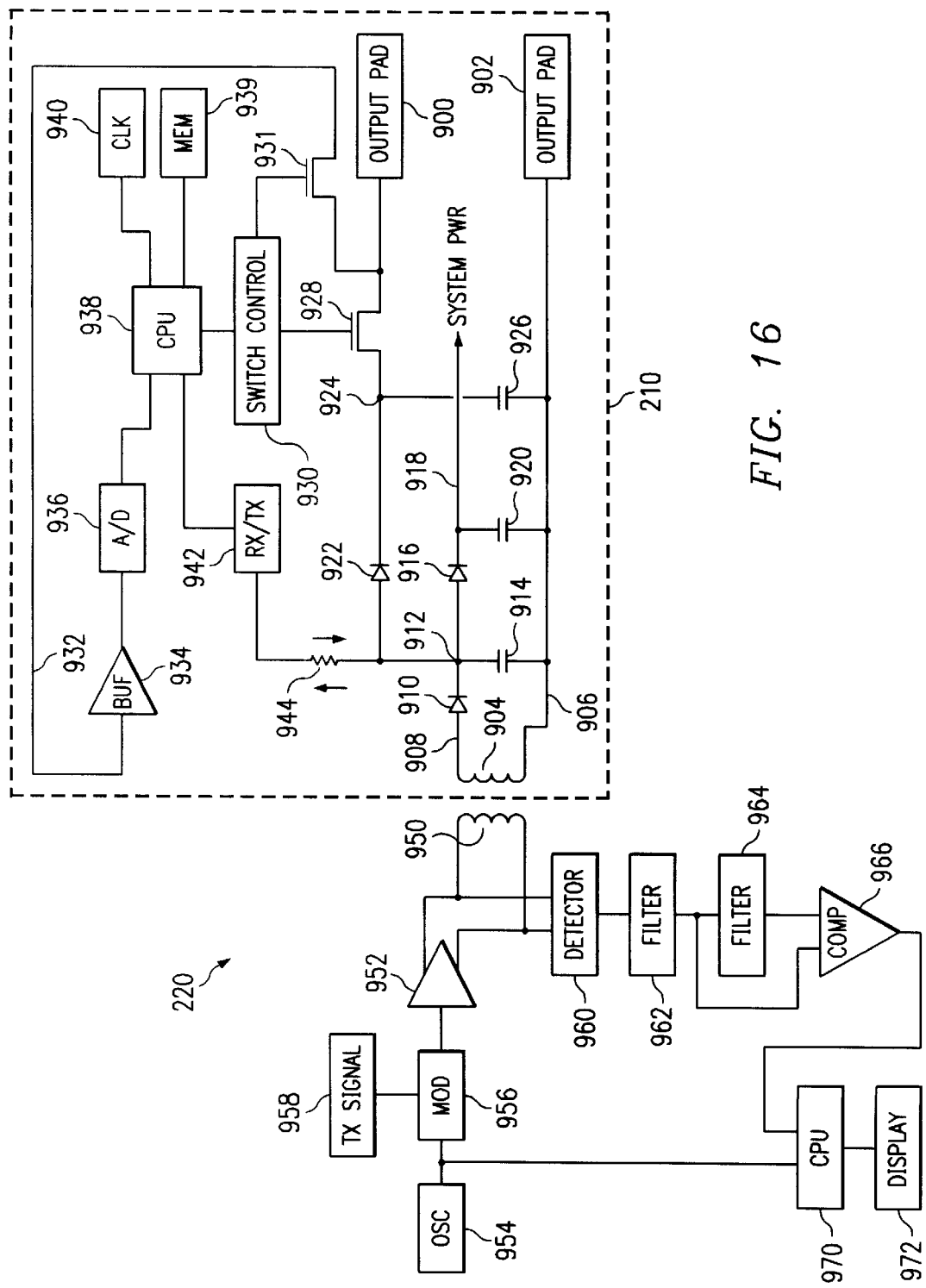
FIG. 16 illustrates a schematic block diagram of the receiver/transmitter and a detection/power system.

Referring now to FIG. 16, there is illustrated a schematic block diagram of the sensor module 210 and the remote system for the powering/detection operation. The sensor module 210, as described hereinabove, is operable to provide two output interfaces, an output power node 900 and an output power node 902 for providing output power for the sensor module 210 to create an external stimulus in some applications. (Such external stimulus may not be applicable to MWD, but this feature will be described for completeness). The illustrated embodiment of FIG. 16 is that associated with a "passive" system, which term refers to the fact that there is no battery associated therewith. In order to operate the system, there is provided an inductive coupling element 904 in the form of an inductor, which is operable to pick up an alternating wave or impulse via inductive coupling and extract the energy therein for storage in the inductive element 904. This will create a voltage across the inductive element 904 between a terminal 906 and a terminal 908. A diode 910 is connected between the node 908 and a node 912, with the anode of diode 910 connected to node 908 and the cathode of diode 910 connected to a node 912. Typically, the diode 910 will be fabricated as a Schotky diode, but can be a simple P/N semiconductor diode. For the purposes of this embodiment, the P/N diode will be described, although it should be understood that a Schottky diode could easily be fabricated to replace this diode 910. The reason for utilizing a Schottky diode is that the Schottky diode has a lower voltage drop in the forward conducting direction.

The diode 910 is operable to rectify the voltage across the inductive element 904 onto the node 912, which has a capacitor 914 disposed between node 912 and node 906. Node 912 is also connected through a diode 916 having the anode thereof connected to node 912 and the cathode thereof connected to a node 918 to charge up a capacitor 920 disposed between node 918 and 906. The capacitor 920 is the power supply capacitor for providing power to the sensor module 210. The capacitor 914, as will be described hereinbelow, is operable to be discharged during operation of the system and, therefore, a separate capacitor, the capacitor 920, is required for storing power to power the system.

The node 912 is connected to the anode of a diode 922, the cathode thereof connected to a node 924. The node 924 is connected to one side of a main capacitor 926, the other side thereof connected to a node 906. A capacitor 926, as will be described hereinbelow, is operable to provide the primary discharge energy to the output power pad 900. The node 924 is connected to one side of the gate/source path of a transistor 928, the other side thereof connected to the output pad 900. The gate of the transistor 928 is connected to the output of a switch control circuit 930. The transistor 928 is operable to be turned on for a short period of time to connect to the top plate of the capacitor 926 to the output pad 900 and subsequently, to conduct current to the desired medium in applications that require such power. Also, this stimulus could be connected to another device to provide a trigger signal therefore.

In addition to transmitting energy out on the outpad 900, there is also provided a second sense transistor 931 which has one side of the gate/source path thereof connected to the output pad 900 and the other side thereof connected to a node 932. The gate of transistor 931 is connected to the output of the switch control 930. The node 932 is connected to the input of a buffer 934 to generate an analog signal output thereof which is then converted with an analog-to-digital converter 936 to a digital value for input to a central processing unit (CPU) 938. The CPU 938 is operable to receive and process this digital input voltage. A clock circuit 940 is provided for providing timing to the system. A memory 939 is provided in communication with the CPU 938 to allow the CPU 938 to store data therein for later transmittal back to the remote location or for even storing received instructions. The memory 939 can be volatile or it can be non-volatile, such as a ROM. For the volatile configuration, of course, this will lose all information when the power is removed.

The CPU 938 is operable to provide control signals to the switch control 930 for turning on the transistor 928 or the transistor 931 at the appropriate time. Once the transistor 928 is turned off, then the transistor 931 can be turned on. Alternatively, the transistor 931 could be a pass-through circuit such that the CPU 938 can always monitor the voltage on the output node 900. However, it is desirable with the transistor 931 and the sensing operation to sense the output power after the output voltage has been provided thereto for a short duration of time.

In order to communicate with the CPU 938 for transferring data thereto and for allowing the CPU 938 to transfer data therefrom, a receive/transmit circuit 942 is provided for interfacing to the node 912 to a resistive element 944. This allows RF energy to be transmitted to the node 912. It is important to note that the semiconductor junction across the diode 910 is a capacitive junction. Therefore, this will allow coupling from the node 912 to the node 904. Although not illustrated, this could actually be a tuned circuit, by selecting the value of the capacitance inherent in the design of the diode 910. In any event, this allows an RF connection to be provided across the diode 910 while allowing sufficient energy to be input across the conductive element 904 to provide a voltage thereacross for rectification by the diode 910 and the capacitor 914. Typically, the frequency of this connection will be in the MHz range, depending upon the design. However, many designs could be utilized. Some of these are illustrated in U.S. Pat. No. 4,333,072 by Biegel, entitled "Identification Device" and issued Jun. 1, 1982, and U.S. Pat. No. 3,944,982 by Mogi et al. entitled "Remote Control System For Electronic Apparatus" and issued Mar. 16, 1976, both of which are hereby incorporated by reference. With these types of systems, power can continually be provided to the node 912 and subsequently to the capacitors 920 and 926 to allow power to be constantly applied. The diode 922 may not be required in order to provide the sufficient charge to the capacitor 926, but some type of isolation is required between the capacitor 926 and the capacitor 920. Additionally, it may be that some voltage regulation is required in order to provide a shaped pulse on the output pad 900. This could be provided by the switch control 930.

The remote system 220 includes an inductive element 950 which is operable to be disposed in an area proximate to the sensor module 210. The inductive element 950 is driven by a driving circuit 952 which provides a differential output that is driven by an oscillator 954. This will be at a predetermined frequency and power level necessary to couple energy from the inductive element 950 to the inductive element 904. Since this is an external system, the power of the oscillator 954 can be set to a level to account for various power losses. To allow information to be transmitted, a modulation circuit 956 is provided which is modulated by a transmitter signal in a block 958 that allows information to be modulated onto the signal of the oscillator 954. However, it should be understood that the information that is transmitted to the sensor module 210 could merely be date information, and the CPU 938 could operate independent of any transmitted information to provide the correct timing for the output pulses and the correct wave shape therefor. Alternatively, the entire control of the system could be provided by the transmit signal 950 and the information carried thereon, since power must be delivered to the illustrated embodiment due to the lack of any independent power in the sensor module 210.

When the information is received from the sensor module 210, it is superimposed upon the oscillator signal driving the inductive element 950. This is extracted therefrom via a detector 960 which has the output thereof input to a first low pass filter 962 and then to a second low pass filter 964. The output of the low pass filters 962 and 964 are compared with a comparator 966 to provide the data. The filter 962 will provide an average voltage output, whereas the filter 964 will provide the actual digital voltage output. The output of the comparator 966 is then input to a CPU 970 which also is powered by the oscillator 954 to process the data received therefrom. This can be input to a display 972.

Figure 17:
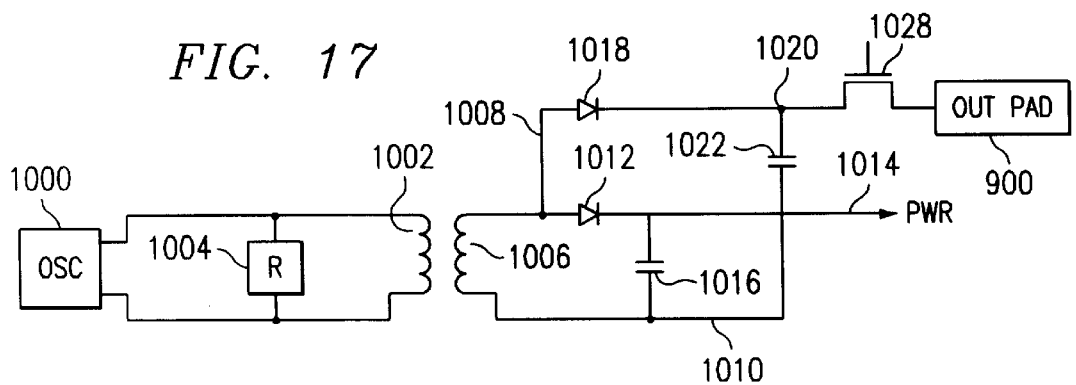
FIGS. 17–19 illustrate alternative embodiments for the receiver/transmitter and the storage capacitors associated therewith.
Figure 18:
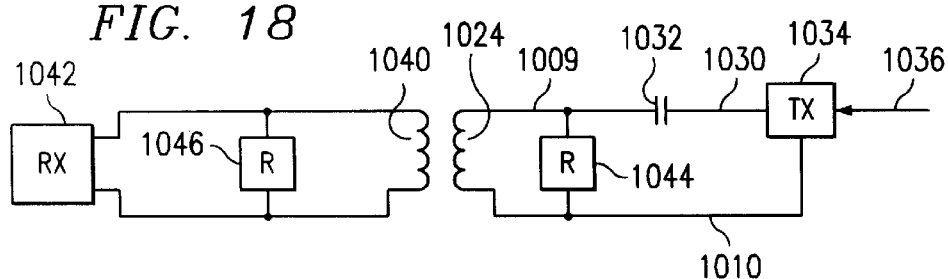
Figure 19:
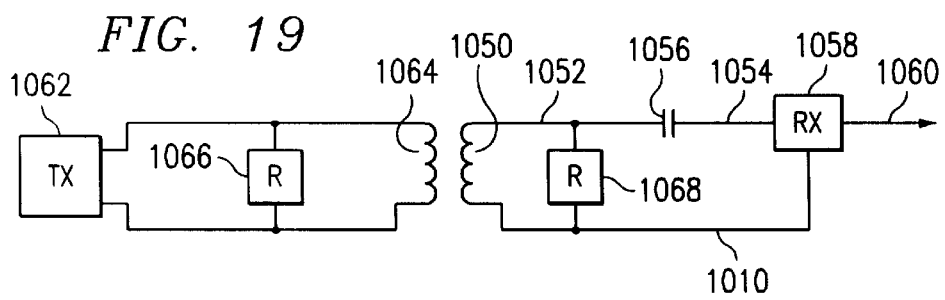

Referring now to FIGS. 17–19, there are illustrated alternate embodiments for the transmit/receive operation. In FIG. 17, there is provided an oscillator 1000 which drives an external inductive element 1002. Typically, there is some type of a load 1004 disposed across the inductive element 1002. This is the primary power that is provided to the system. A separate inductive element 1006 is provided on the sensor module 210, for being inductively coupled to the inductive element 1002. Thereafter, a voltage is generated across the inductive element 1006, the inductive element 1006 being connected between nodes 1008 and 1010. A diode 1012 is connected between the node 1008 and a power node 1014, a power supply capacitor 1016 is disposed across the node 1014 and the node 1010. This allows the voltage on the node 1008 to be rectified with a diode 1012. Similarly, a diode 1018 is connected between the node 1008 and a node 1020 which is connected to one side of a main capacitor 1022. The other side of capacitor 1022 is connected to the node 1010. The capacitor 1022 is similar to the main capacitor 926 in FIG. 16. The switch transistor 1028 is provided for connecting the node 1020 to the output pad 900 for applying power to a medium or to another device as a trigger signal.

Referring now to FIG. 18, the receive operation in this embodiment utilizes a separate inductive element or an antenna 1024 in the sensor module 210, which is operable to be connected between the nodes 1009 and 1010. The node 1009 is capacitively coupled to a transmit node 1030 with a capacitor 1032, the capacitor 1032 being a coupling capacitor. A transmitter 1034 is provided for transmitting received data from a line 1036 to the node 1030, which is then coupled to the node 1009 to impress the RF signal across the inductive element 1024.

A corresponding inductive element 1040 is disposed on the external remote controller, which the inductive element 1040 is operable to be disposed proximate to the inductive element 1024. The inductive element 1040 is basically a "pick-up" element which is operable to receive information and function as an antenna and provide the received signal to a receiver 1042. The structure of FIG. 18 is a separate structure, such that the node 1009 is isolated from the node 1008, the power receiving node. However, it should be understood that any harmonics of the oscillator 1000 would, of course, leak over into the inductive element 1024. This can be tuned out with the use of some type of tuning element 1044 on the sensor module 210 disposed across the inductive element 1024 and also a tuning element 1046 disposed across the inductive element 1040, i.e., the antenna.

Referring now to FIG. 19, there is illustrated a simplified diagrammatic view of the transmit portion. The sensor module 210 has associated therewith a separate receive antenna or an inductive element 1050 disposed between the node 1010 and a node 1052. The node 1052 is capacitively coupled to a receive node 1054 with a coupling capacitor 1056. A receiver 1058 is provide for receiving the information transmitted thereto and providing on the output thereof data on a data line 1060. The receiver 1058 is operable to receive the RF signal, demodulate the data therefrom, and provide digital data on the output 1060. External to the sensor module 210 is a transmitter 1062 which is operable to impress a signal across an external inductive element 1064. The inductive element 1064 basically provides the RF energy and is essentially tuned with a tuning element 1066. A corresponding tuning element 1068 is provided on the sensor module 210 and disposed across the inductive element 1050, the inductive element 1050 acting as an antenna, as well as the inductive element 1064.

Figure 20:
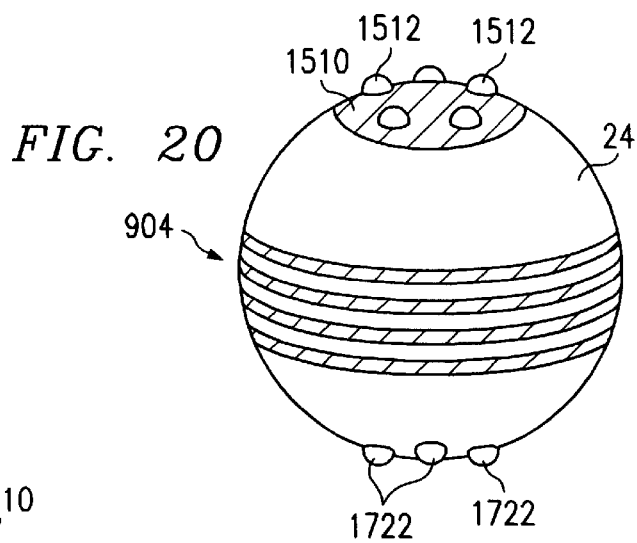
FIG. 20 illustrates a perspective view of one of the semiconductor spheres having the antenna leads disposed thereon.

Referring now to FIG. 20, there is illustrated a perspective view of the spherical IC providing a sensor module 24 (similar to sensor module 210), wherein the inductive element 904 is illustrated as being strips of conductive material wrapped around the exterior of the sensor module 24. The inductive element 904 described hereinabove with respect to FIG. 16, is formed of a conductive strip wrapped many times around the spherical IC 24. The length of these wires depends upon the receive characteristics that are required. As described hereinabove with reference to FIGS. 17–19, there could be multiple conductive strips, each associated with a receive function, a transmit function or a power function, or they could all share one single conductive element or strip. On one end of the sensor module 24, as described hereinabove, there is provided an anode output pad 1510 having conductive balls 1512 associated therewith of material such as gold. On the other end thereof are provided interfacing interconnect balls 1722.

Figure 21:
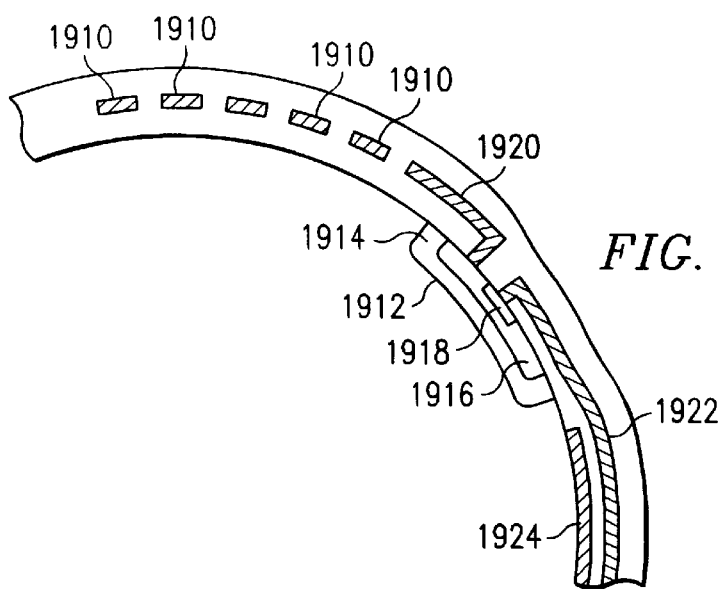
FIG. 21 illustrates a cross-sectional diagram of the portion of the surface of the spherical IC of FIG. 20.

Referring now to FIG. 21, there is illustrated a cross-sectional diagram of the surface of the sensor module 24 illustrating the conductive strips forming the inductive element 904 of FIG. 20. The conductive strips are referred to by reference numeral 1910 which are spaced beneath the surface of the sensor module 24 by a predetermined distance and separated therefrom by a layer of silicon dioxide. A passivation layer is disposed over the upper surface of the conductive strips 1910. The conductive strips 1910 can be fabricated from polycrystalline silicon but, it would be preferable to form them from a metal layer to result in a lower conductivity strip. This will allow the strips 1910 to be narrower and separated from each other by a larger distance. This separation would reduce the amount of capacitance therebetween.

Figure 22:
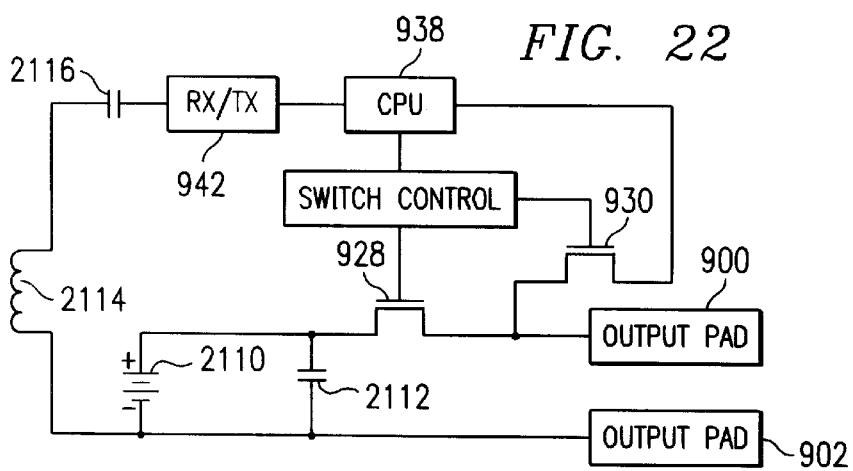
FIG. 22 illustrates a schematic block diagram of the circuitry utilizing a battery as the primary power source.

Referring now to FIG. 22, there is illustrated a schematic block diagram of the sensor module 24 illustrating the use of a battery 2110. The battery 2110 is connected to a capacitor 2112. The capacitor 2112 could be identical to the capacitor 926 of FIG. 16 in that it could be formed on the surface of the spherical semiconductor substrate providing the sensor module 24, or it could actually be part of the structure 2110. The battery 2110 is provided across the capacitor 2112 to provide sufficient charge therefor. Additionally, the capacitance 2112 could actually be the capacitance of the battery 2110. Additional structure could be provided for powering the CPU 938 and the other circuitry on the chip from the battery 2110. As such, there would only be required a smaller inductive element 2114 and a capacitor 2116 to allow the receive/transmit block 942 to receive/transmit information from and to the remote exterior station 220.

Figure 23:
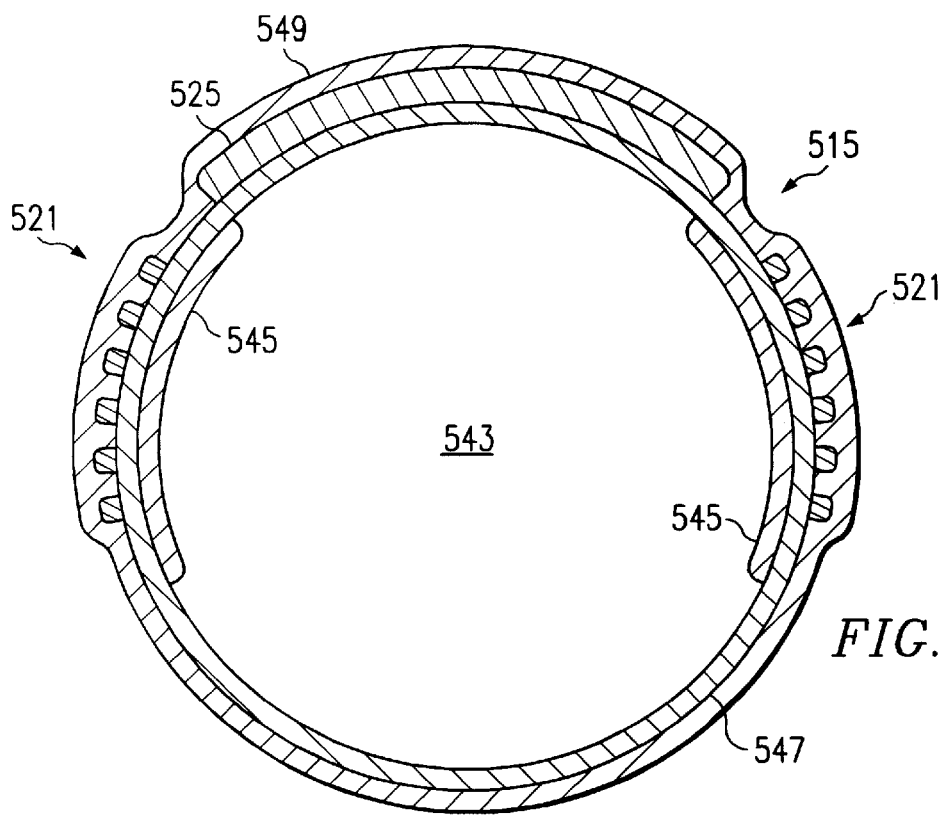
FIG. 23 illustrates a sectional view of one embodiment of a temperature transponder according to the present invention.

In FIG. 23, there is illustrated a transponder 515 includes a temperature sensor of one of the sensor modules 24, which in the preferred embodiment is a thermistor 525. A thermistor is a resistive circuit component having a high negative temperature coefficient of resistance. While a thermistor is the preferred temperature sensor of the present invention, those skilled in the art will recognize that other semiconductor temperature sensing technologies can be incorporated in the transponder 515 of the present invention. For example, temperature sensors of the type disclosed in U.S. Pat. No. 5,154,514 by Gambino et al. entitled "On-chip Temperature Sensor Utilizing A Schottky Barrier Diode Structure" issued Oct. 13, 1992, or U.S. Pat. No. 5,821,599 by Rupp entitled "Temperature Sensor Having A P-N Junction" issued Oct. 13, 1998, the disclosures of which are hereby incorporated by reference, may be used.

Still referring to FIG. 23, the transponder 515 preferably comprises a substantially spherical-shaped semiconductor device on which an integrated circuit has been formed. Such a spherical-shaped integrated circuit semiconductor device (sometimes referred to herein as a "ball") is described in co-pending, commonly assigned U.S. Pat. No. 5,955,776 by Ishikawa et al. entitled "Spherical-Shaped Semiconductor Integrated Circuit," issued Sep. 21, 1999 and also published by the World Intellectual Property Organization, International Bureau, with the International Publication No. WO 98/25090, on Jun. 11, 1998, the disclosure of both of which are hereby incorporated by reference.

The transponder 515 is built on a substantially spherical semiconductor substrate 543, which may be doped P-type or N-type in accordance with the particular requirements of the fabrication process. Semiconductor circuitry, indicated generally at 545, resides on the substrate 543. The circuitry 545 includes a power regulator, a voltage controlled oscillator, an RF oscillator, a mixing circuit, and an amplifier as well as other circuitry. The substrate 543 and the circuitry 545 are covered by an insulating layer 547. The insulating layer 547 is preferably formed of silicon dioxide or phosphosilicate glass.

A power coil 521 is formed of helically wrapped windings over the insulating layer 547. The power coil 521 may be fabricated from a depositive layer of aluminum that is patterned and etched using conventional semiconductor fabrication techniques. The actual number of individual windings of the power coil 521 may be far greater than the six shown in FIG. 23. The thermistor 525 is adhered to the surface of the insulating layer 547. Suitable connections are provided through the insulating layer 547 to the circuitry 545. The transponder 515 is coated with or encapsulated in a layer 549 of an inert material, such as phosphosilicate glass or a ceramic. The coating 549 is of the type which can withstand hostile downhole well conditions.

Figure 24:
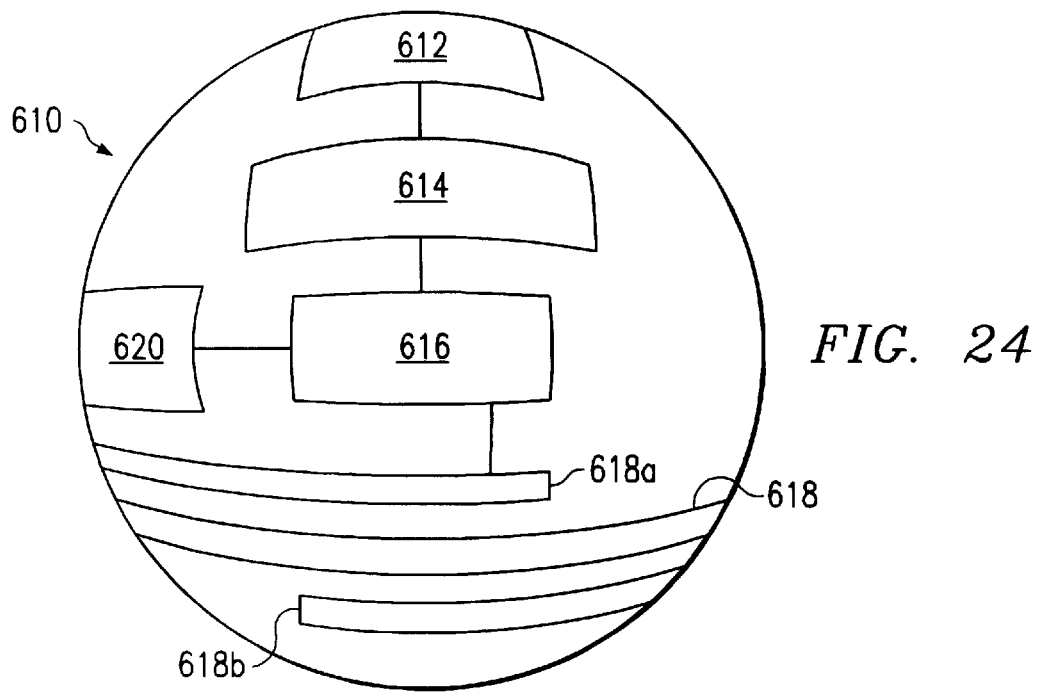
FIG. 24 illustrates a schematic side view of a spherical-shaped semiconductor device incorporating a transducer in accordance with the present invention.

Referring to FIG. 24, there is illustrated one example of a layout of a spherical-shaped semiconductor device or ball for use in one of the sensor modules 24, and designated generally by a reference numeral 610. The spherical semiconductor 610 includes a transducer 612 fabricated on a surface portion that can be exposed to a medium to be sensed. The transducer 612 is connected to integrated circuitry including signal processing circuitry 614, which in this example comprises an A/D converter. The transducer 612, a signal processor 614 and other integrated circuitry on the spherical substrate 610 are powered by a power regulator 616, which provides a relatively constant DC voltage of about 3.0 volts to the circuits on the spherical substrate 610. A preferred power source for the spherical substrate 610 is a coil 618 that is energized by a separate nearby source (not shown here but external system 220, for example) that generates a varying magnetic field. Alternatively, the spherical substrate 610 can be powered by a miniature battery (not shown) connected to the spherical substrate 610 as well as to clusters of similar spherical substrates with different functions, such as memory. The miniature battery can also be in the shape of a battery spherical substrate to accommodate a common connection scheme between adjacent spherical substrates. Preferably, such battery spherical substrates can be electric double layer condenser, manganese dioxide, lithium, carbon, or lithium ion, etc. Since such battery spherical substrate is a higher energy source than an RF energy receiving coil, longer communication distances can be achieved. An example of an apparatus and method for clustering spherically shaped semiconductors is disclosed in U.S. Pat. No. 5,877,943 by Ramamurthi, entitled "Clustering Adapter For Spherical Shaped Devices," and issued Mar. 2, 1999, which is hereby incorporated by reference.

The coil 618 has ends 618a and 618b that are connected by subsurface conductors (not shown) to the other circuit elements on the spherical substrate 610. It will be appreciated that the coil 618 may have many more windings than the three windings actually shown. The signal processor 614 provides an output to a transmitter 620 that preferably radiates an RF signal to a receiver (not shown) at another location. Both the magnetic field generator and receiver can be included in a common computer-controlled apparatus or CPU station within proximity of the spherical substrate 610 at least when its operation is required.

Figure 25:
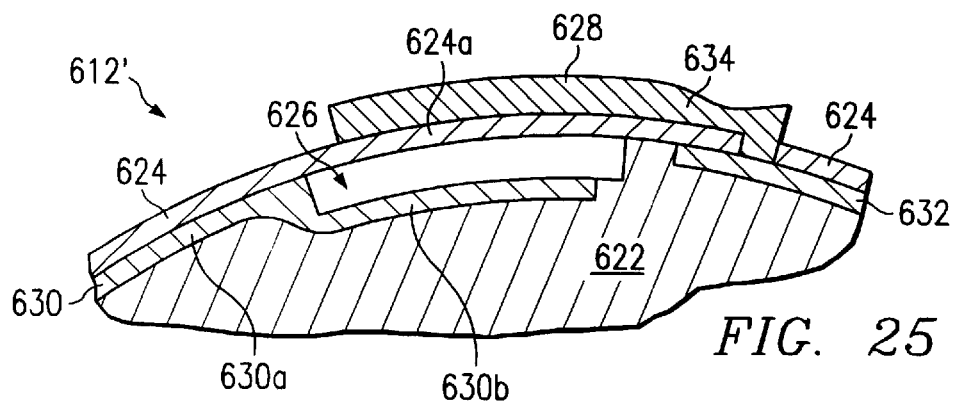
FIG. 25 illustrates an enlarged cross section of a portion of the device of FIG. 24 showing an example of a transducer structure in accordance with the present invention.

Referring to FIG. 25, a transducer 612' is shown in schematic cross section and represents one of many different possible implementations of the transducer 612 of FIG. 24. The transducer 612' is formed atop a semiconductor substrate 622, which is preferably doped P-type and serves as the electrical ground for the circuits on the spherical substrate 610. A dielectric layer 624 lies on the outer surface of the substrate 622 and overlies a cavity 626 cut down into the substrate 622. Lying atop the dielectric layer 624 and juxtaposed with the cavity 626 is an electrode 628. Extending along a surface portion of the substrate 622 and beneath the cavity 626 is a first N-type region 630, which may be formed by selectively introducing a dopant such as phosphorus by a conventional technique such as ion implementation. The region 630 has a portion 630a to the left of the cavity 626 and a portion 630b underneath the cavity 626. A second N-type region 632 is provided at a surface portion of the substrate 622 and to the right of the cavity 626. An extension 634 of the electrode 628 makes contact to a region 632 through an opening in the dielectric layer 624.

Figure 26:
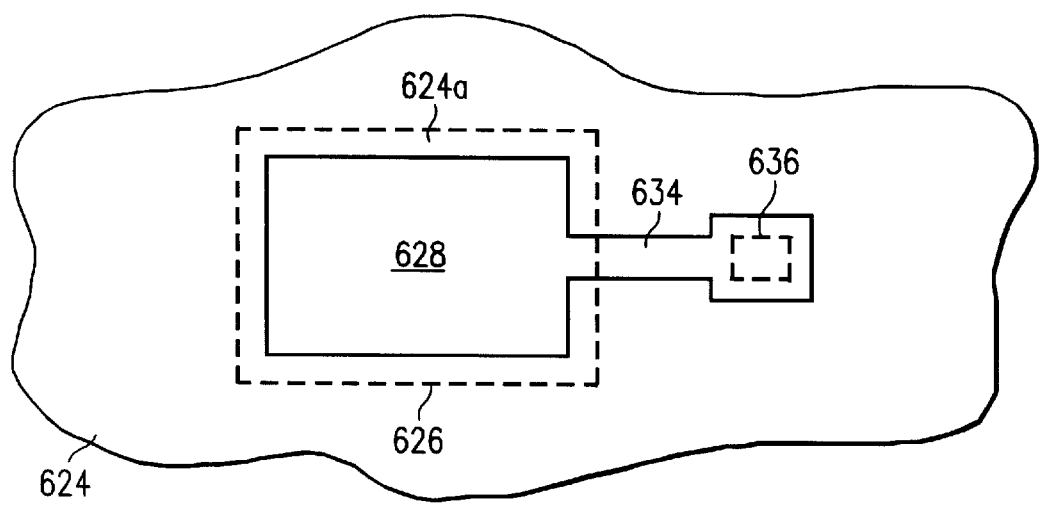
FIG. 26 illustrates a plan view of the transducer of FIG. 25.

With reference to FIG. 26, a possible layout for the electrode 628 and the cavity 626 therebelow is illustrated. The extension 634 is shown extending out to a contact point 636 where contact to the N-type region 632 is made through the dielectric layer 624, as depicted in FIG. 25.

It will be appreciated that the structure of the transducer 612' of FIGS. 25 and 26 forms a variable capacitor with the electrode 628 serving as one capacitor plate and the portion 630b of the N-type region 630 beneath the cavity 626 serving as the other capacitor plate. The N-type regions 630 and 632 extend to points of interconnection (not shown) with other circuitry, as will be described below with reference to FIG. 27. The variable capacitor is responsive to changes in pressure applied to the electrode 628. The top surface of electrode 628 is exposed to a medium, such as a fluid, that exerts a variable pressure on the electrode 628. The force of this pressure is applied by the electrode 628 to the underlying portion of the dielectric layer 624, designated 624a in FIG. 25, which serves as a diaphragm. The dielectric diaphragm 624a is sufficiently flexible to respond to the force of the pressure variations by moving down slightly into the cavity 626 with increasing pressure and back up to the position shown at a base-line pressure, such as atmospheric pressure. It will be appreciated that the capacitance of the capacitor defined by the plates 628 and 630b will thus vary as a function of the pressure variations seen by the transducer 612'. The extension 634 is sufficiently thin and narrow that it will flex as the dielectric diaphragm 624a flexes up and down.

For the transducer application of FIGS. 25 and 26, the spherical substrate 610 of FIG. 24 is preferably about one millimeter in diameter. For other applications, it may be possible to make the diameter much smaller, limited only by the process technology and other practical considerations.

Techniques for producing a diaphragm above a cavity that can be used to implement the structure generally shown in FIG. 25 in a more specific structure are known in the art, such as are disclosed in U.S. Pat. No. 4,665,610 by Barth, entitled "Method Of Making A Semiconductor Transducer Having Multiple Level Diaphragm Structure," and issued May 19, 1987, which is hereby incorporated by reference. It will be appreciated that other implementations of a pressure transducer that are known in the art can be employed as alternatives to the transducer 612' of FIG. 25.

Figure 27:
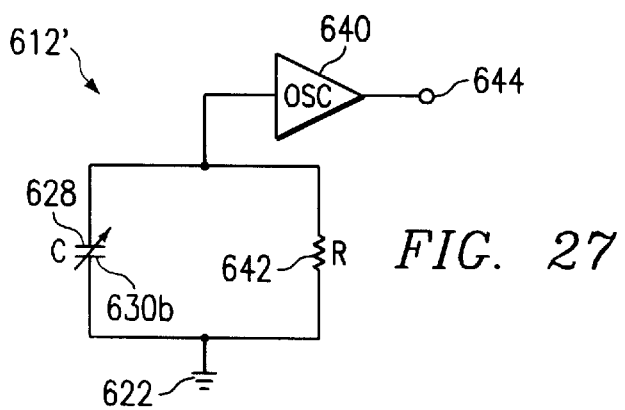
FIG. 27 is an implementation of a transducer circuit in accordance with the present invention.

With reference to FIG. 27, other circuit elements of the transducer 612' will be described. The variable capacitor, designated by the letter C, has an upper plate 628 connected to an oscillator circuit 640, and has a lower plate 630b connected to the substrate 622, which is indicated by the ground potential symbol. A resistor 642, designated by the letter R, is connected in parallel with the capacitor C. The oscillator circuit 640 provides an output 644 that oscillates at a frequency that is a function of the product of the values of R and C. This phenomenon and specific circuitry for implementing an oscillator such as oscillator 640 are well known. Accordingly, it will be appreciated that the oscillator output 644 will oscillate at a frequency that is proportional to the capacitance of capacitor C, which varies with the sensed pressure variations as described above.

Figure 28:
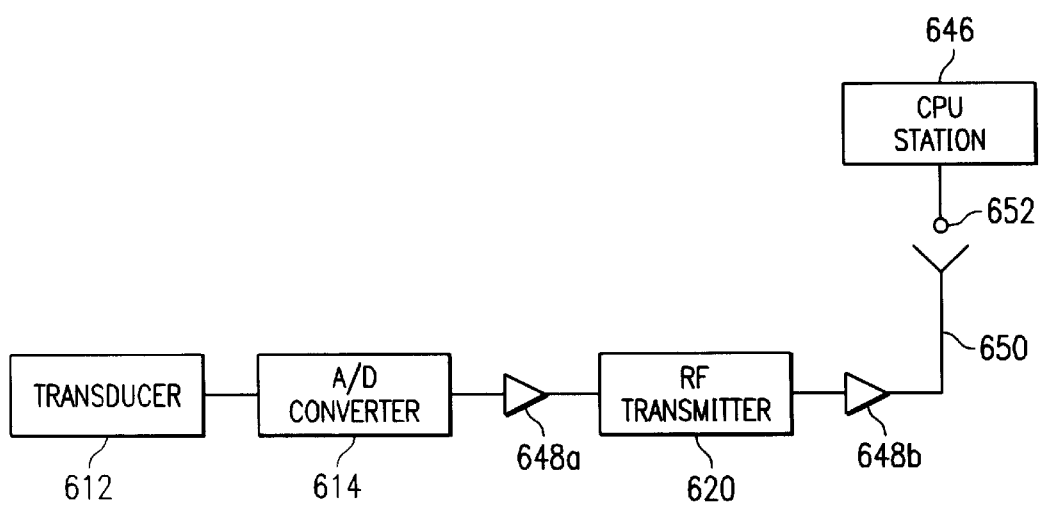
FIG. 28 illustrates a block diagram of a transducer communication system in accordance with the present invention.

Referring to FIG. 28, a generalized circuit is shown for communicating the output of the transducer 612, such as the specific transducer 612', to a nearby CPU station 646 (similar to external processing circuit 220) by RF transmission. The transducer 612 has its output connected to the signal processor 614, which in this case is an A/D converter. The A/D converter 614 can have its output amplified as needed by a first amplifier 648a and then input to RF transmitter 620. A second amplifier 648b amplifies the output of the RF transmitter 620 and energizes an antenna 650. The CPU station 646 includes an antenna 652 that receives the RF signal radiated by the antenna 650.

Figure 29:
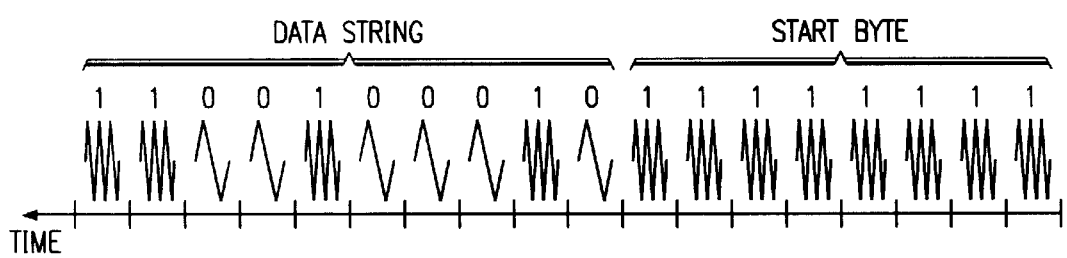
FIG. 29 illustrates a graphical illustration of a data transmission technique that may be used with the present invention.

In a preferred implementation of the RF transmitter 620, its output signal has a series of pulses, each pulse being at one of two different RF frequencies, as depicted graphically in FIG. 29. Pulses representing binary "ones" are transmitted at a relatively high frequency, and pulses representing binary "zeros" are transmitted at a relatively low frequency. A start signal is used to begin each data transmission by the transmitter 620 and synchronize reception by the CPU station 646. For example, the start signal can be a start byte of eight "ones" in a row. The A/D converter 614 can be programmed so that it never outputs a data string containing eight "ones" in a row. Thus, the CPU station 646 can receive the start byte and following data string, and then extract the binary data from the data string. It will be appreciated that other known data transmission techniques can be used in implementing the present invention. A lookup table stored in a memory (not shown) in the CPU station 646 can be used to interpret the binary data as value corresponding to the condition of the medium sensed by the transducer 612.

The present disclosure has application to any of various transducers that can be fabricated using semiconductor processes. The transducer may be a sensor that senses a condition of a medium, as with the pressure transducer described above, or the transducer may be an actuator that energizes a medium in response to onboard electrical signals. For example, a strain gauge or piezoresistor can be used for sensing pressure, particular implementations of which are described in U.S. Pat. No. 4,050,313 by Shimada et al. entitled "Semiconductor Pressure Transducer," issued Sep. 27, 1977 and U.S. Pat. No. 4,618,844 by Takahashi et al. entitled "Semiconductor Pressure Transducer," issued Oct. 21, 1986. Strain gauges my also be fabricated for passing power through an inductor coil to sense changes in the magnetic permanence of structural members, such as those made of iron, to determine the three dimensional strain in such members, such as that set forth in U.S. Pat. No. 5,492,017 Jennings et al. entitled "Inductive Pressure Transducer," issued Feb. 20, 1996, which is hereby incorporated by reference. Strain readings may then be used to determine the forces and torque applied to such structural members. Numerous examples of photodiodes for sensing light and light emitting diodes (LEDs) for transmitting light are known in the semiconductor arts. Ionic sensors such as pH sensors are known in the art, an example being disclosed in U.S. Pat. No. 5,814,280 by Tomita et al. entitled "Semiconductor PH Sensor And Circuit And Method Of Making Same," issued Sep. 29, 1998. Other possibilities include acoustic sensors (miniature microphones) and acoustic actuators (miniature loudspeakers). Also, accelerometers can be fabricated using semiconductor processing techniques as disclosed in U.S. Pat. No. 5,656,512 by Beitman entitled "Method Of Manufacturing A Semiconductor Accelerometer," issued Aug. 12, 1997. The patents referred to above are hereby incorporated by reference.

Figure 30:
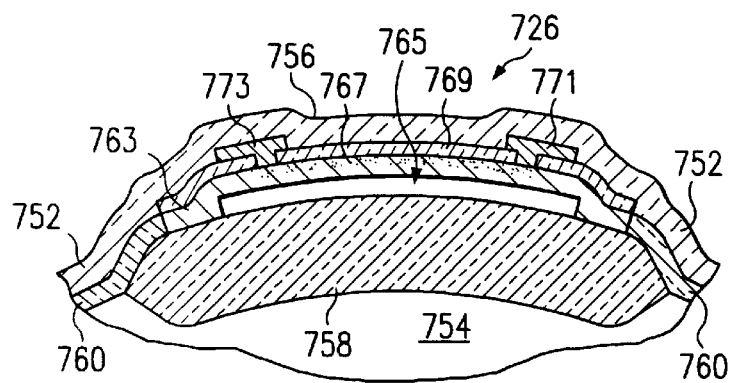
FIG. 30 illustrates a greatly enlarged portion of the monitor of FIG. 2 that includes the transducer.

Referring to FIG. 30, an alternative pressure transducer 726 for use in the sensor modules 24 will be described. By way of example, the transducer 726 may consist of a strain gauge fabricated atop the field oxide 758. A dome 763 is supported at its periphery by the field oxide 758 and defines a cavity 765 between the dome and the field oxide 758. The dome 763 preferably comprises monocrystalline silicon and includes an elongated doped resistor 767, which is indicated by the stippling at the outer surface of the silicon dome 763. A dielectric layer 769, such as silicon dioxide, overlies the dome 763. Metal contacts 771 and 773 are formed atop the dielectric layer 769 and extend therethrough to make contact with the opposite ends of the doped resistor 767. The metal contacts 771 and 773 have extensions (not shown in the cross section) that interconnect the resistor with circuitry of the previously described processor 732.

The structure of FIG. 30 can be fabricated by forming a layer of selectively etchable material in the shape of the cavity 765 atop the field oxide layer 758. For example, a phosphorus doped oxide can be deposited on the surface of the device, and then patterned into the desired shape by photolithographic techniques adapted to the spherical shape of the device. Next, the silicon dome 763 is formed, such as by the deposition of polycrystalline silicon followed by recrystallization. Alternatively, the monocrystalline silicon layer used to make the dome 763 can be epitaxially grown, such as by seeding the growth from an exposed portion of the substrate 754 adjacent to the field oxide 758. Such techniques are known, as described in U.S. Pat. No. 4,754,314 by Scott et al. entitled "Split-Level CMOS," issued Jun. 28, 1988. A patterning procedure is then used to define the ultimate shape of the periphery of the dome 763. Then, peripheral ports (not shown) are etched at opposite sides of the dome 763 down to the doped oxide layer. Next, the device is exposed to an acid that preferentially etches doped oxide at a much faster rate than undoped silicon dioxide. It is well known that hydrofluoric acid will etch phosphorus doped oxide at a much faster rate (e.g., 15 times faster) depending on the phosphorus doping level and oxide density. The acid flows into the peripheral ports and etches the doped oxide layer laterally beneath the silicon dome 763 to create the cavity 765. The acid is then flushed out to introduce air or other gas, such as nitrogen, into the cavity 765. Then, the outer dielectric layer 769 is formed followed by the contacts 771 and 773. The deposition of the silicon dioxide of the dielectric layer 769 fills the peripheral ports and seals the cavity 765.

In a variation of the foregoing technique, a thin silicon nitride layer (not shown) can be deposited on the field oxide layer 758 to serve as an etch-stop layer, followed by the deposition and patterning of the selectively etchable oxide layer. Optionally, another thin silicon nitride layer can be deposited atop the patterned oxide layer prior to the formation of the silicon layer 763. These additional steps can facilitate preferential lateral etching of the patterned oxide layer to create a cavity like the cavity 765, since hydrofluoric acid etches oxide at a much faster rate (e.g., 50 times faster) than silicon nitride.

In operation, the strain gauge 726 senses pressure applied to the dome 763 through the dielectric layers 752 and 769. As the pressure increases, the dome 763 flexes downward very slightly, which also compresses the gas in the cavity 765 to a slight degree. The resistance of the resistor 767 varies in proportion to the variations in pressure of the fluid adjacent the outer surface 756 of the dielectric layer 753. The characteristics of semiconductor strain gauges are known in the art. U.S. Pat. No. 4,618,844 by Takahashi et al. entitled "Semiconductor Pressure Transducer," issued Oct. 21, 1986, describes such a semiconductor strain gauge whose essential characteristics are similar to the strain gauge 726 of FIG. 30.

Figure 31:
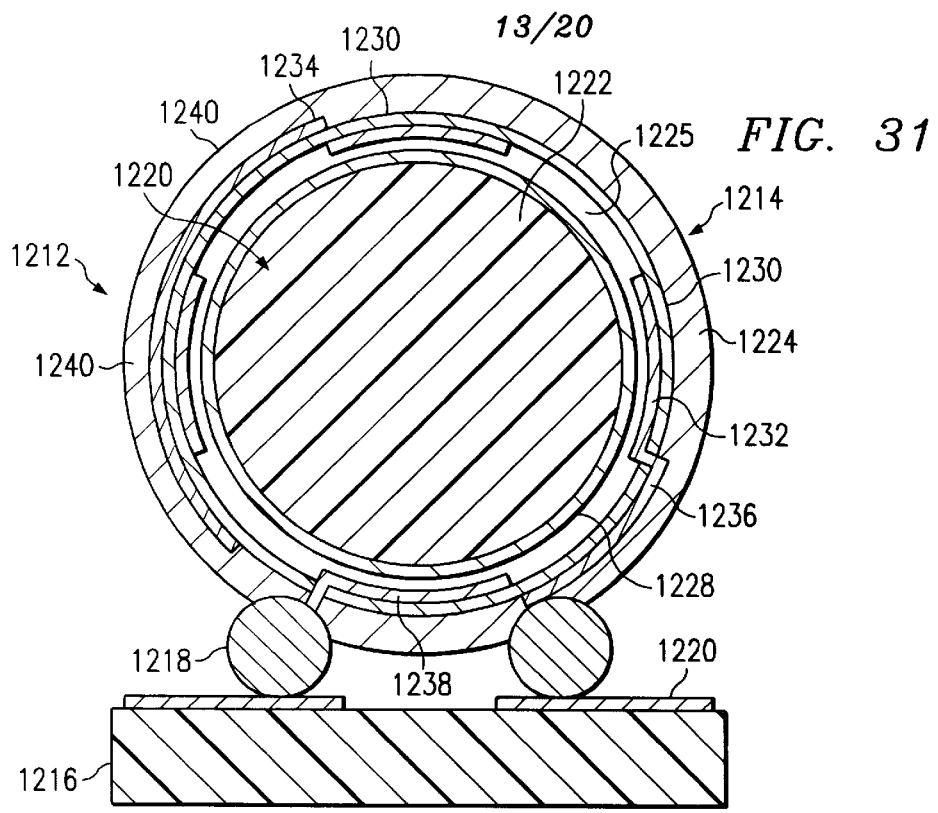
FIG. 31 illustrates a sectional view which schematically depicts the various components of a motion sensor made of a spherical semiconductor substrate.

Referring now to FIG. 31, there is illustrated a motion sensor 1212 provided by a substantially spherical substrate semiconductor for use in one of the sensor modules 24. As described below, the motion sensor 1212 may be used for three dimensional measurements as an inclinometer, an accelerometer, a gyroscope or a magnetometer. Such uses are also not limited to oil field applications, but may also have broad applications to other fields, such as to medial, robotics, navigational, aeronautic and marine applications, and the like. The motion sensor 1212 includes a spherical substrate section 1214 which is mounted to a substrate 1216 by connector bumps 1218. The connector bumps 1218 are preferably provided by a solder material. The substrate 1216 has interconnects 1220 for connecting the connector bumps 1218 to other circuitry mounted to the substrate.

The sensor spherical substrate section 1214 includes an inner core 1222 and an outer shell 1224. A gap 1225 exists between the inner core 1222 and outer shell 1224. The inner core 1222 is formed of a solid semiconductor 1220. The semiconductor material used may silicon, germanium, silicon carbide, or other suitable materials for fabricating solid state circuits therefrom. The surface of the core 1222 has an outer conductive metalization layer 1228, which is preferably provided by titanium nitride.

The outer shell 1224 has a plurality of electrodes 1230, preferably six. The electrodes 1230 preferably have circular peripheries and are aligned such that one pair of the electrodes 1230 are disposed on opposite sides of the interior of the outer shell 1224 and define axes which are orthogonal to axes defined by respective oppositely disposed pairs of the other electrodes 1230. The electrodes 1230 are formed on the interior surface of a dielectric layer 1232, which is preferably made of silicon dioxide. Vias 1234 extend through the dielectric layer 1232 for passage of interconnects 1236 which connect the electrodes 1230 to contacts 1238. The contacts 1238 are connected to the connector bumps 1218. An outer layer 1240 of the shell 1224 is provided by a material which provides mechanical strength. Preferably, the shell is a photosensitive polymer EPON SU8 which provides the outer layer 1240.

Figure 32:
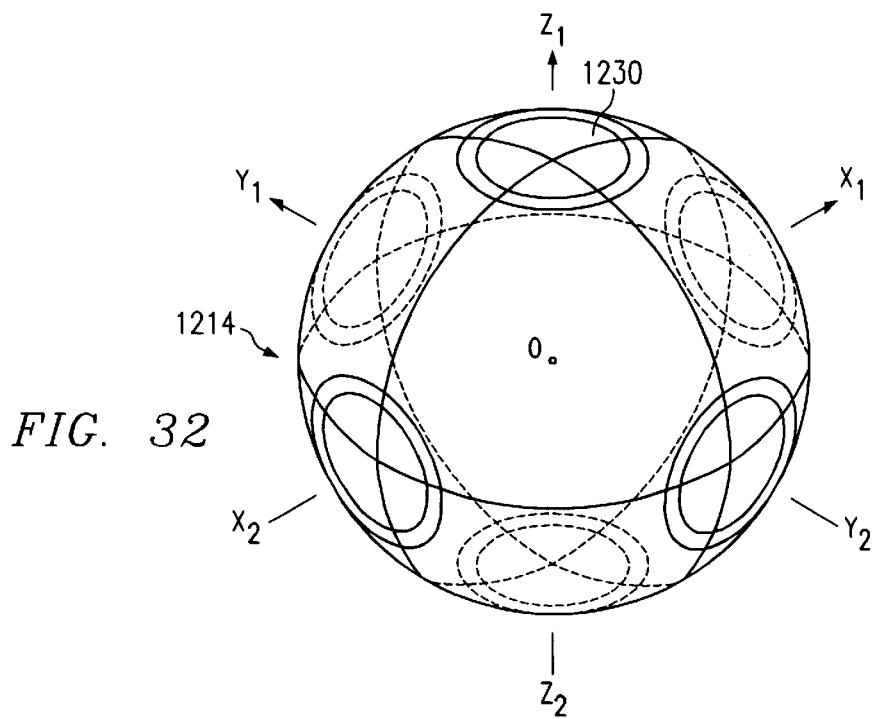
FIG. 32 illustrates a perspective view of the motion sensor.

Referring now to FIG. 32, there is illustrated a perspective view of the sensor spherical substrate 1214 of the motion sensor 1212. The various electrodes 1230 are shown defining various ones of the mutually orthogonally disposed axes X-X, Y-Y and Z-Z of a Cartesian coordinate system.

Figure 33:
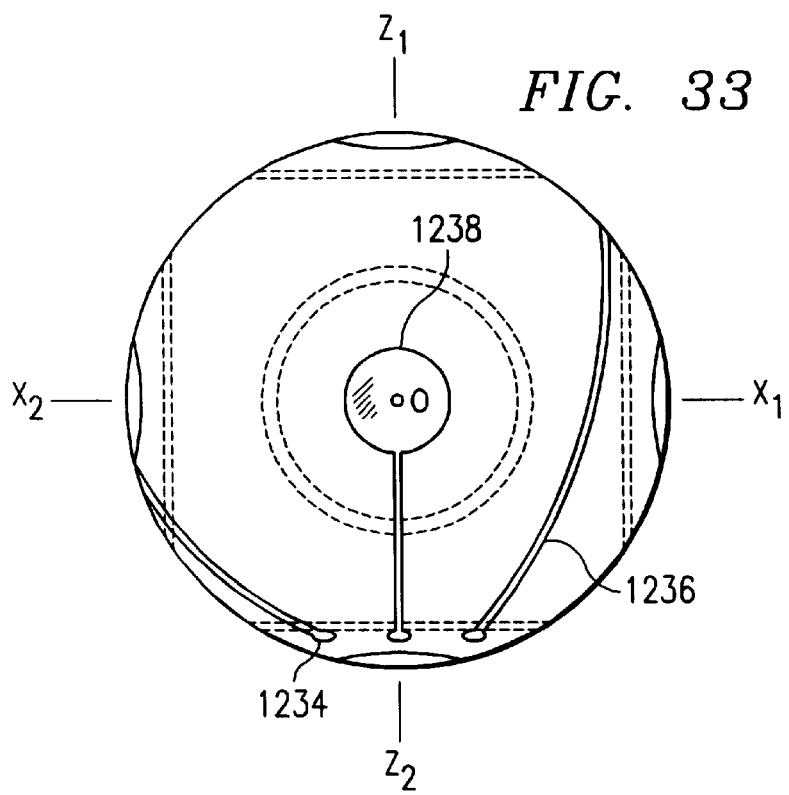
FIG. 33 illustrates a side elevation view of the motion sensor, with an outer layer removed to expose interconnect circuits.

Referring now to FIG. 33, there is illustrated a side elevation view of the motion sensor 1212, with the outer layer 1240 removed to expose the vias 1234, the interconnects 1236 and the contacts 1238.

Figure 34:
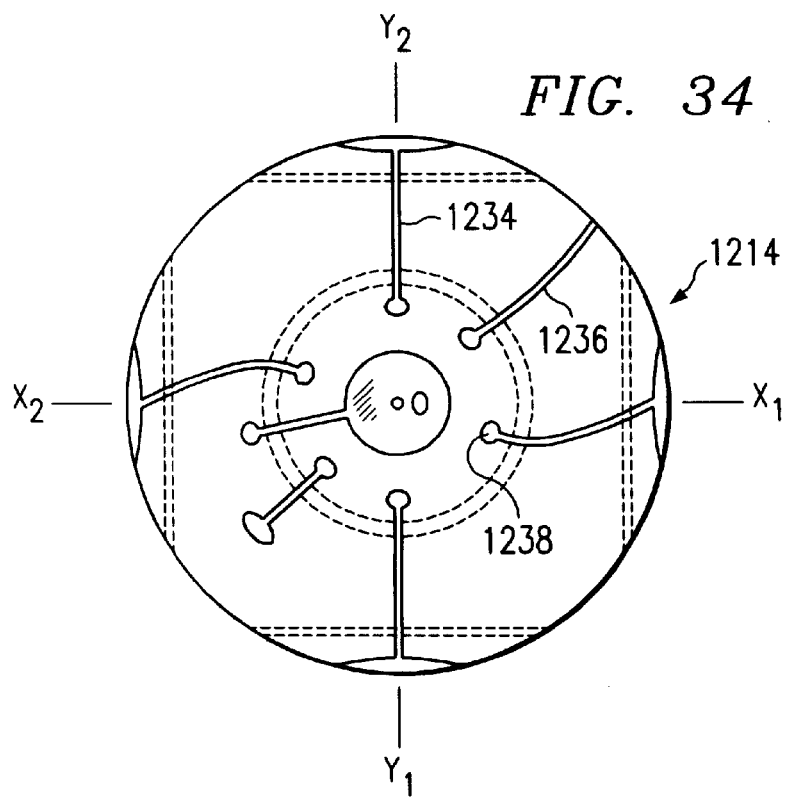
FIG. 34 illustrates a bottom view of a the motion sensor, with the outer layer removed to expose the interconnect circuits.

Referring now to FIG. 34, there is illustrated a bottom view of the sensor spherical substrate 1214, with the outer layer 1240 removed such that the interconnects 1236, the vias 1234 and through the contacts 1238 are disclosed. The bumps 1218 will be secured to the contacts 1238, preferably on the lowermost portion of the sensor spherical substrate 1214.

Figure 35:
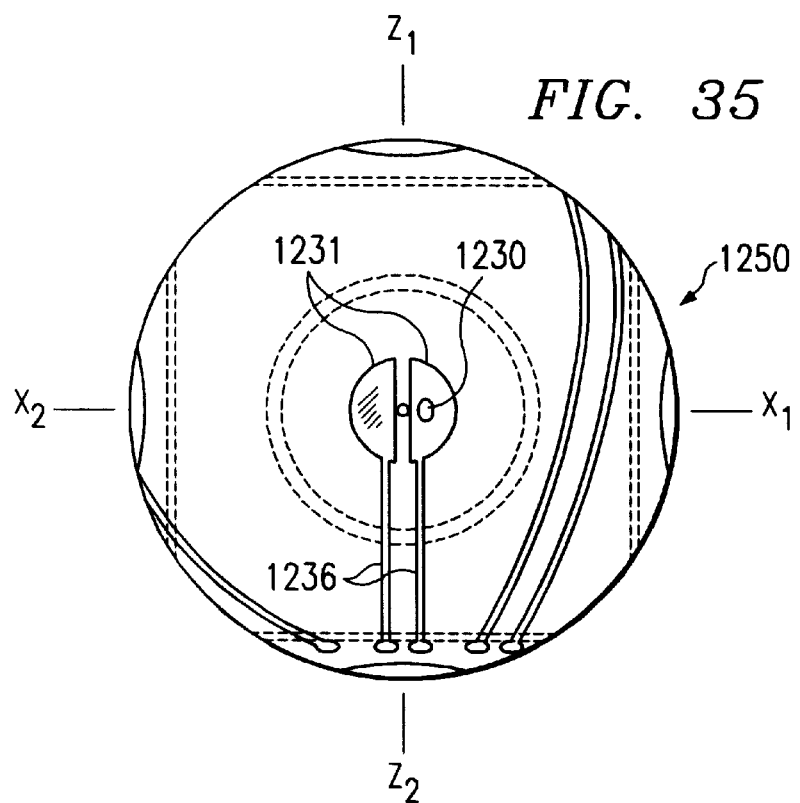
FIG. 35 illustrates a side elevation view of an alternative motion sensor, with the outer layer removed to expose interconnect circuits.
Figure 36:
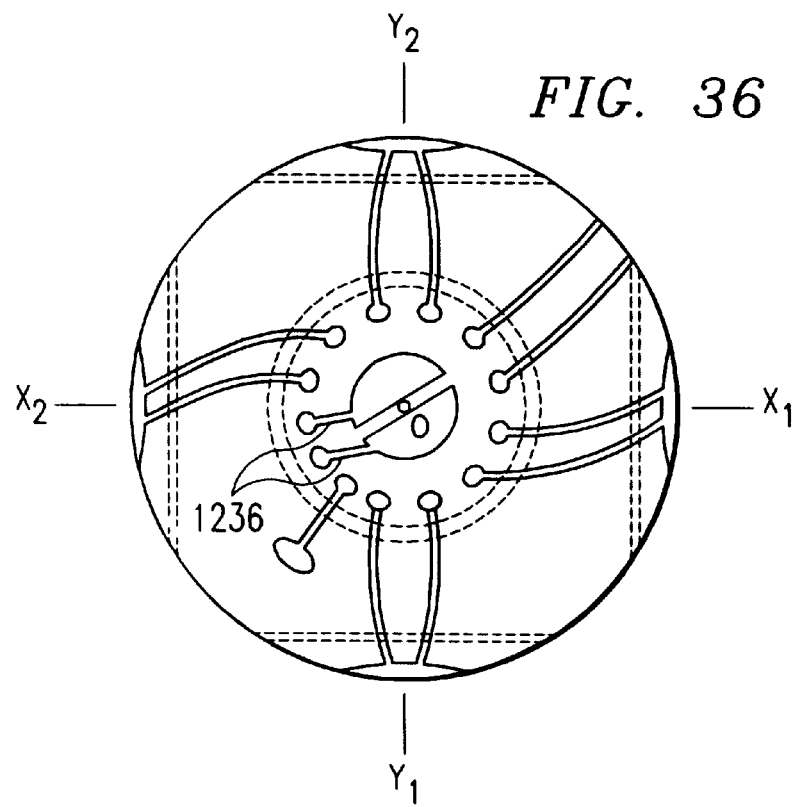
FIG. 36 illustrates a bottom view of the alternative motions sensor, with the outer layer removed to expose the interconnect circuits.

Referring now to FIGS. 35 and 36, there are illustrated a side elevation view and a bottom view of an alternative motion sensor spherical substrate 1250, respectively, with the outer layer 1240 removed. The motion sensor spherical substrate 1250 has electrodes 1230 are provided such that there are an adjacent pair of electrodes 1231 on each of the locations for the electrodes 1230 of the sensor spherical substrate 1214, which are electrically isolated and contact separate interconnects 1236 to connect separate contacts 1238.

Figure 37:
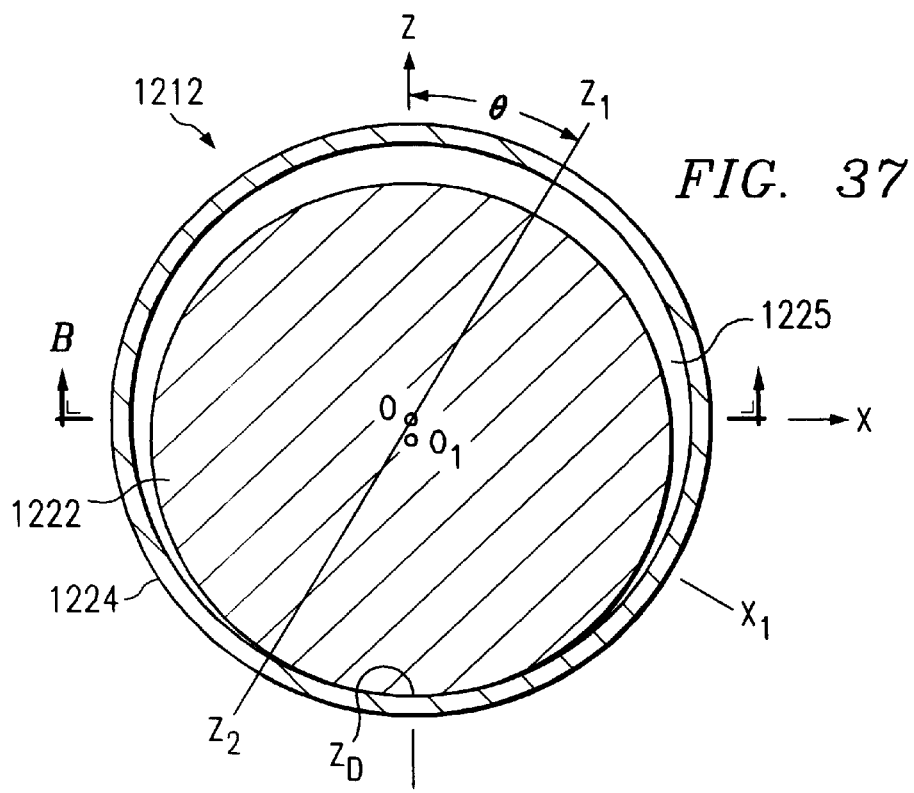
FIG. 37 illustrates a sectional view of the motion sensor, showing the motion sensor being operated in an inclination sensing mode.

Referring now to FIG. 37, there is illustrated a sectional view depicting operation of the motion sensor 1212 in an inclination sensing operating mode. In the inclination sensing operating mode, value for the capacitance between the various ones of the electrodes 1230 and the outer conductive metalization layer 1228 of the inner core 1222 are measured, such that the sizes of the gap 1225 between respective ones of the electrodes 1230 and the outer metalization layer 1228 of the inner core 1222 are determined by detecting the respective values of the capacitances therebetween. Thus, as the size of the gap 1225 changes with respect to various ones of electrodes 1230, the respective values for the capacitance therebetween may be determined to determine the respective sizes of the gap 1225 at the respective ones of electrodes 1230, and thereby the relative positioning of the inner core 1222 within the outer shell 1224.

Figure 38:
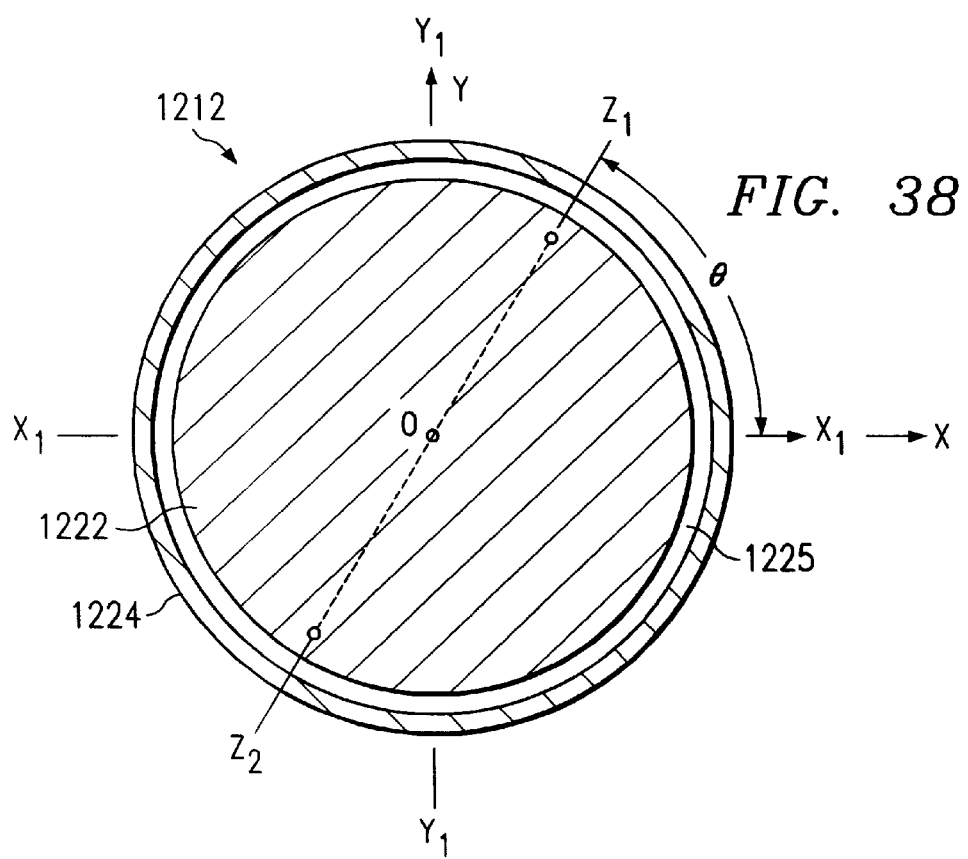
FIG. 38 illustrates a sectional view of the motion sensor, showing the motion sensor being operated in an accelerometer mode.

Referring now to FIG. 38, there is illustrated a side elevational, sectional view of the motion sensor 1212 when being operated in an accelerometer mode. DC voltages are applied to respective ones of electrodes 1230, such that the inner core 1222 is electromagnetically levitated and maintained in a centered position, concentrically disposed within the outer shell 1224. The value for the capacitance between the metalization layer 1228 of the inner core 1222 and the electrodes 1230 is measured using an AC power source and then the detected capacitance value is used as a feedback mechanism to determine the relative positioning of the inner core 1222. The DC voltages are applied to respective ones of the electrodes 1230 in respective values which are determined in accordance to the detected capacitance values for corresponding ones of the electrodes 1230, to concentrically center the inner core 1222 within the outer shell 1224. The values of the voltages applied to the respective electrodes 1230 maintain the inner core in a concentric position within the outer shell 1224 are used to determine the acceleration to which the motion sensor 1212 is exposed, and to determine the direction of the acceleration.

Still referring to FIG. 38, there is illustrated operation of the motion sensor in a gyroscope mode to determine relative angular positioning of the motion sensors 1212 around a central axis of rotation $Z_1$–$Z_2$. Voltages are applied across the electrodes 1230 to levitate the inner core 1222, and also such that the inner core 1222 will spin, and be disposed in a levitated position, concentric with the outer shell 1224. Relative positioning of the axis of rotation of the inner core 1222 relative to the electrodes 1230 is sensed to determine the amount of relative rotation from an initial position between the axes of the outer shell 1224 and the central axis rotation of the inner core 1222. It should be noted that when utilized in the gyroscopic mode, the motion sensor 1212 is useful for determining rotation relative to two mutually orthogonal axes. A second motion sensor 1212 may be used to determine relative rotation of the second motion sensor 1212 relative to a central axis of rotation of an inner core 1222, which is disposed orthogonal to the axes of rotation of the first motion sensor 1212, to filly define the angular positioning of a sensor module in three dimensions.

Referring yet still to FIG. 38, there is also illustrated operation of the motion sensor 1212 in a magnetometer mode of operation. Voltages are applied across the electrodes 1230 such that the inner core 1222 is in a levitated position, concentric with the outer shell 1224. Magnetic charges are then applied to the inner core 1222, such that at least one of the outer conductive metalization layer 1228 and the core 1222 will be polarized with north and south magnetic poles to respond to exteriorly applied magnetic fields, such as the earth's magnetic field. Relative positioning of the inner core 1222 with respect to the outer shell 1224 in three dimension may thus be detected with the electrodes 1230 of the outer shell 1224.

Figure 39:
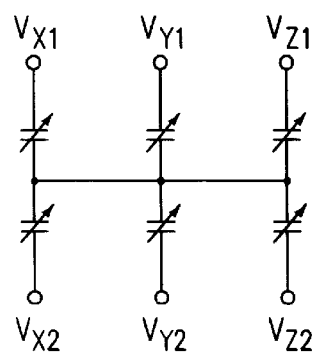
FIG. 39 illustrates a diagrammatic view of a circuit representing the motion sensor.

Referring now to FIG. 39, there is illustrated a circuit which schematically depicts the motion sensor 1212 as an electric circuit. When utilized in either of an inclination mode, an accelerometer mode or a gyroscope mode, the capacitance between the outer metalization layer 1228 of the inner core 1222 and of various ones of the electrodes 1230 varies (as represented by the variable capacitors in the circuit) and can be measured at the points Vx, Vy, and Vz.

Figure 40:
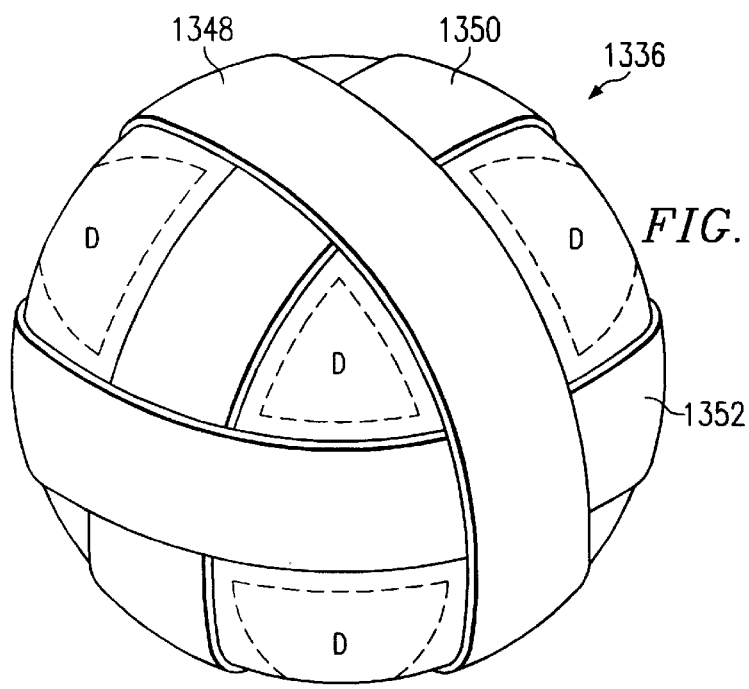
FIG. 40 illustrates a perspective view of a spherical dosimetry transponder in accordance with the present invention.

Now referring to FIG. 40, there is illustrated a diagrammatic view of an embodiment of a preferred dosimetry transponder 1336 for use in one of the sensor modules 24. The dosimetry transponder 1336 includes three sets of coils 1348, 1350 and 1352 arranged in bands that extend around a spherical-shaped semiconductor substrate, which may be fabricated using techniques described in the above-referenced patent application entitled "Spherical Shaped Semiconductor Integrated Circuit." The coils within the first band 1348 are arranged in parallel planes that are perpendicular to a first axis. The coils within the second band 1350 are arranged in parallel planes that are perpendicular to a second axis. The coils within the third band 1352 are arranged in parallel planes that are perpendicular to a third axis. The first, second and third axes are mutually orthogonal. The reason for this arrangement of coils is described more completely in the above-referenced patent application entitled "Position Sensing System." Radiation sensitive diodes D indicated by the dash lines are arranged in the spaces not covered by the bands of coils 1348, 1350 and 1352.

Figure 41:
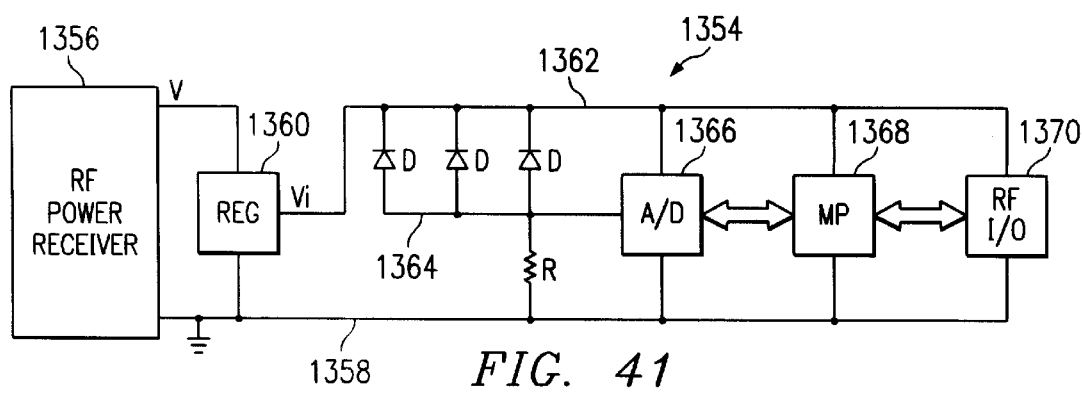
FIG. 41 illustrates a circuit diagram for a dosimetry transponder in accordance with the present invention.

Now referring to FIG. 41, there is illustrated a circuit diagram for the transponder 1336 shown and designated generally by reference numeral 1354. The transponder circuit 1354 includes an RF power receiver 1356, which includes coils for inductively receiving RF energy that is converted to a voltage V above an internal ground rail 1358. The voltage V is converted by voltage regulator (REG) 1360 to an internal operating voltage $V_i$. The internal voltage $V_i$ is supplied to the other circuitry of the transponder 1336 along a voltage supply rail 1362. The voltage $V_1$ reversed biases parallel connected diodes D, only three of which are specifically shown in FIG. 41, although additional diodes D may be included. A resistor R is connected to the diodes D at a node 1364 and to the ground rail 1358. The node 1364 provides a reference voltage to an A/D converter 1366. The output of the A/D converter 1366 is provided to a microprocessor (MP) 1368. The microprocessor 1368 includes a memory (not shown) that stores a unique serial number or "ID" code for identifying the particular transponder 1336. The microprocessor 1368 controls data communications from and to the transponder 1336 by means of an RF input-output ("RF I/O") circuit 1370.

Figure 42:
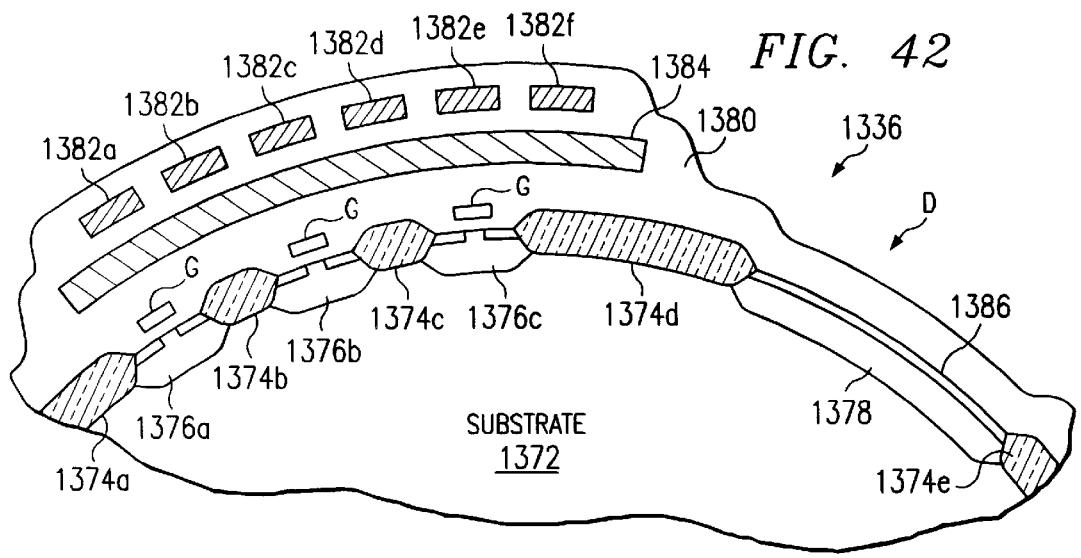
FIG. 42 illustrates a partial cross-section of a portion of a dosimetry transponder in accordance with the present invention.

Now referring to FIG. 42, there is illustrated an enlarged view of a surface portion of a transponder 1336. The transponder 1336 includes a spherical semiconductor substrate 1372 fabricated in accordance with techniques described in the above-referenced U.S. Pat. No. 5,955,776 by Ishikawa et al. entitled "Spherical-Shaped Semiconductor Integrated Circuit," issued Sep. 21, 1999. The substrate 1372 is one conductivity type, such as N-type, which can be fabricated from phosphorous doped silicon. Thick field oxide layers 1374a, 1374b, 1374c, 1374d and 1374e are formed on the surface of the substrate 1372 at discreet locations to define separate active areas therebetween. The active areas may include P-type wells 1376a, 1376b, 1376c and 1378. Within the wells 1376a, 1376b and 1376c are NMOS transistors with polysilicon gates G. The gates G are embedded in a lower portion of a multi-level dielectric layer 1380. Individual windings 1382a, 1382b, 1382c, 1382d, 1382e and 1382f are shown embedded in an upper portion of the dielectric layer 1380. The individual windings may be portions of separate coils used for different purposes. For example, windings 1382a and 1382b can be used for RF power input to the transponder 1336. Windings 1382c and 1382d can be used for RF data input, and windings 1382e and 1382f can be used for RF data output. Preferably, a ferromagnetic layer 1384 is disposed beneath the coil windings to enhance current induction. An N-type layer 1386 is formed at the surface of the substrate 1372 between field oxide portions 1374d and 1374e. The N-type layer 1386 together with underlying P-type layer 1378 define one of the diodes D, indicated in FIGS. 40 and 41.

It will be appreciated that the reverse leakage current of the diodes D is affected by the radiation experienced by the transponder 1336. This phenomenon is described in the Rikner et al. article referred to above. The radiation to which the transponder 1336 is exposed creates lattice defects in the monocrystalline silicon in the vicinity of the PN junction between the P-type region 1378 and the N-type region 1386. These defects are permanent so that the radiation has a cumulative effect on the reverse leakage current of each of the diodes D. The diodes D are connected in parallel, as shown in FIG. 41, to define a dosimeter whose output is applied at the node 1364. The voltage at the node 1364 increases cumulatively with the radiation applied to the diodes D. Data corresponding to the voltage level on the node 1364 may be recorded during predetermined time increments of relatedly short duration, preferably corresponding to depth intervals of one to six inches, such that values for naturally occurring gamma radiation within a well may be determined.

Referring again to FIG. 42, it will be appreciated that the active radiation of chemical sources used in conventional MWD logging tools may have an impact on the active circuits of the transponder 1336, such as the transistors located in active areas 1376a, 1376b and 1376c. In accordance with an important feature of the invention, these active areas are covered by the ferromagnetic layer 1384 and the coils 1382a–1382f, thus protecting to some degree the active circuitry of the transponder 1336 from the radiation to which it is exposed. This permits the transponder to continue to function properly, even though it ultimately may eventually be rendered useless after prolonged exposure to radiation.

Figure 43:
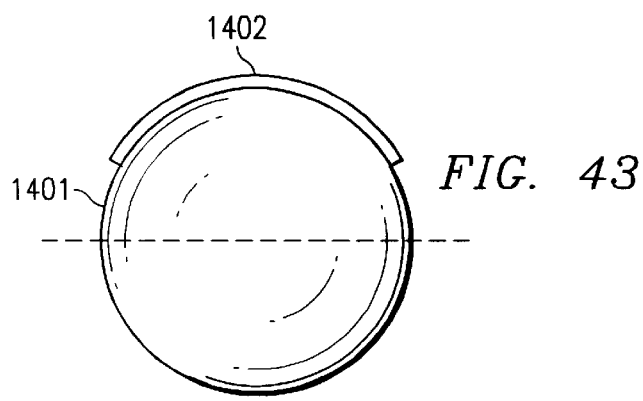
FIG. 43 illustrates a cross-sectional diagram of one of the spherical semiconductor detectors.

Referring now to FIG. 43, there is illustrated a cross-sectional diagram of an alternative gamma radiation sensor for a sensor module 24 formed of a spherical semiconductor 1401 having a pixel element 1402. A spherical semiconductor device is described in the aforementioned U.S. Pat. No. 5,955,776 by Ishikawa et al. entitled "Spherical-Shaped Semiconductor Integrated Circuit," issued Sep. 21, 1999. Each of the pixels 1402 is sized such that the upper surface area of the spherical IC is as completely covered as possible.

Figure 44:
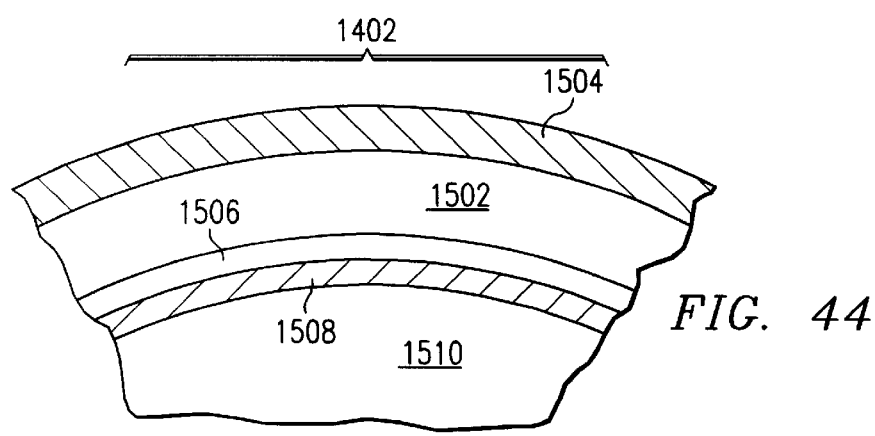
FIG. 44 illustrates a detailed cross section of one of the detector pixels.

FIG. 44 illustrates a more detailed diagrammatic view of each of the pixel elements 1402. The pixel element 1402 is comprised of a layer of amorphous hydrogenated silicon (a-Si:H) 1502 which is disposed under a layer of heavy metal 1504, which is molybdenum (Mo) to form a Schottky diode which allows detection of low energy gamma rays. The layer of Si:H 1502 is disposed over a layer of N-type doped a-Si:H material 1506 which is disposed over a conductive layer 1508. The conductive layer 1508 is disposed on a silicon substrate 1510, which is a substantially spherically shape silicon substrate.

Figure 45:
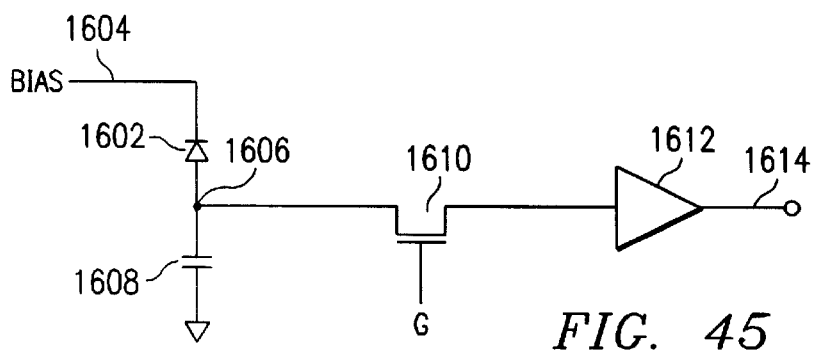
FIG. 45 illustrates a diagrammatic view of a single pixel.

Referring now to FIG. 45, there is illustrated a diagrammatic view of the pixel 1402 as incorporated into a detection element. The pixel 1402 basically comprises a Schottky diode 1602 which has the cathode thereof connected to a bias voltage on a node 1604 and the anode thereof connected to a node 1606. In one embodiment, node 1606 is connected to one plate of a storage capacitor 1608, the other plate thereof connected to ground. The Schottky diode 1602 is operable to collect electrons for storage on the upper plate of the capacitor 1608. This storage of electrons results in an increase in the voltage across the plates of the capacitor 1608 which can later be transferred through a gate transistor 1610 to the input of a charge amplifier 1612 for output on an output node 1614.

The structure and operation of the Schottky diode 1602 is described in K. Aflatooni, A. Nathan, R. I. Hornsey, I. A. Cunningham, "A Novel Detection Scheme for Large Area Imaging of Low Energy X-Rays Using Amorphous Silicon Technology," TECHNICAL DIGEST, $9^{th}$ INT. CONF. ON SOLID-STATE SENSORS AND ACTUATORS, June 16–19, Chicago, 1997, pp. 1299–1302, which is incorporated herein by reference. Such a device should also be operable for gamma radiation, which is electromagnetic radiation of a different wavelength than X-rays, although dimensional modifications may be required. In general, the Schottky diode 1602 is comprised of various layers, one being an anode contact and one being a cathode contact with the layer of a-Si:H material disposed therebetween. The contact thereof has a layer of heavily doped a-Si:H material disposed therein to establish ohmic contact. The top contact, the anode, is formed by the deposition of the heavy metal such as Mo. When the diode is reversed biased, i.e., there is a positive voltage disposed on the anode, this will result in a relatively low reverse bias current, which is a function of the area. Additionally, the reverse current can be affected by the reverse bias voltage, which may result in a time-dependent variation in the reverse current.

In general, it has been reported in the literature that X-ray sensitivity measurements for a 200 $\mu m^2$ Schottky diode with a reverse bias of 2 volts, exhibits a collection of electron versus the X-ray source voltage level kVp will span the range 20 kcV to 100 kcV. At a source voltage of 50 kVp, the measured electrons over a period of 500 ms is approximately $4\times10^7$. At higher energies on the order of 100 kVp, the measured electrons were approximately $2\times10^8$. In general, the thickness of the a-Si:H layer will affect a collection efficiency of electrons in the Schottky diode. Once the intrinsic layer of thickness exceeds the maximum range of the electrons (~1 $\mu$m), the output signal will in general saturate, or decrease, due to the fact that the depletion layer no longer widens resulting in an increased width of the neutral region. This increased width leads to a degradation in the number of collected electrons, particularly when the width of the neutral region exceeds the electron depletion layer.

Referring further to FIG. 45, the electrons are allowed to be collected over a period of approximately 500 ms (it being understood that this number can vary, depending upon the geometry and the processing technology), and are then gated out from the node 1606 at apredetermined time. The amplifier 1612 is a high impedance amplifier that will not cause a significant discharge of the capacitor 1608.

Figure 46:
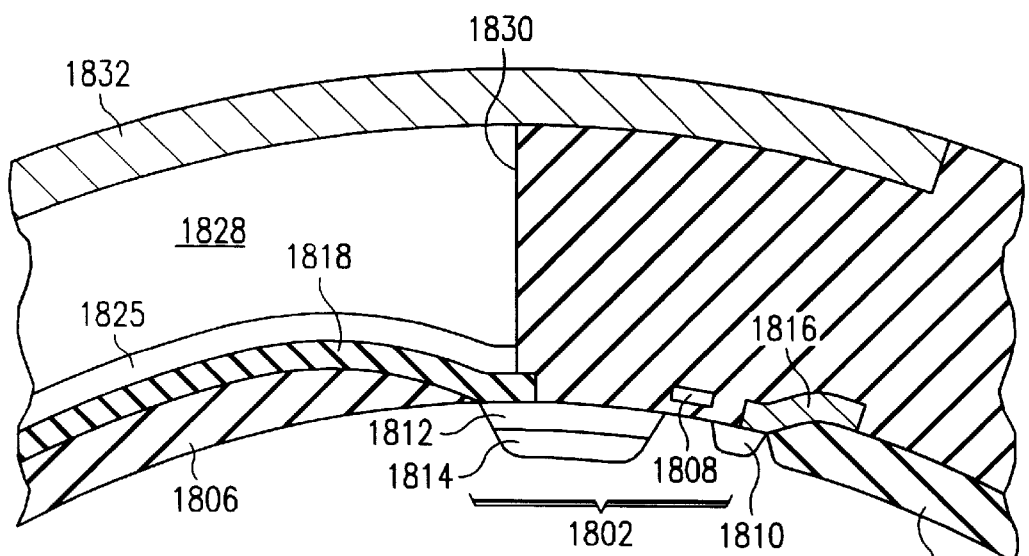
FIG. 46 illustrates a detailed cross-sectional view of the detector pixel and the associated transistor for the pixel.

Referring now to FIG. 46, there is illustrated a cross-sectional diagram of the transistor 1610 and the Schottky diode 1602. During processing, the first step of processing is to form the transistor. The transistor is a standard MOS transistor that would be found in a standard gate or even in a memory cell. In the first step, an active region 1802 is defined which has field oxide regions or isolation regions of insulating material 1804 and 1806 defined on either side thereof. Thereafter, a layer of gate oxide (not shown) will be formed over the substrate and then a gate electrode 1808 patterned and formed thereon. Once the gate electrode 1808 is defined, the source/drain regions are then defined with a self-aligned process wherein the gate electrode 1808 defines the edge of the channel regions. This will result in a source/drain region 1810 formed on one side of the gate electrode 1808 and a source/drain region 1812 formed on the other side of the gate electrode 1808. In the configuration illustrated in the disclosed embodiment of FIG. 46, the source/drain region 1812 is considerably larger than the source/drain region 1810. The reason for this is that this will define the upper plate of the capacitor 1608. The lower plate of the capacitor 1608 is formed with the substrate and the capacitor defined by a depletion region. Therefore, during processing, a depletion implant 1814 is formed beneath the source/drain region 1812. However, this depletion implant may not be there as the capacitor plate can be formed by an inversion layer. This is a conventional structure for a dynamic random access memory (DRAM) cell. The size of the capacitor is a function of the size of the source/drain region 1812.

After formation of the source/drain regions 1812 and 1810, a layer of oxide is disposed over the substrate (not shown) to a predetermined thickness. This is then patterned and etched to define a via at the source/drain regions and then a layer of conformal polycrystalline silicon disposed over the substrate and patterned to form a conductive contact 1816 with the source/drain region 1810 and the remaining conductive lines in the circuit. Typically, prior to forming the conformal layer of polycrystalline silicon, there will be an n+implant made into the source/drain region 1812 at the point which polycrystalline silicon will contact that area to improve the element contact thereof The lower plate of the diode is formed from copper by depositing a layer of copper onto the substrate, and then patterning and etching this layer to form a conductive contact 1818 with the source/drain region 1812. A layer of amorphous silicon is then deposited on the substrate which has a high n+ content. This forms an ohmic contact with the conductor 1818, the lower contact of the diode. Thereafter, a layer of a-Si:H is deposited on the substrate with a sputtering technique which is done at relatively low temperatures with high uniformity. Once deposited, using standard plasma-enhanced chemical vapor deposition (PECVD) processes, these layers are then patterned to define a border 1830 that defines the edge of the pixel 1402. Thereafter, a layer of insulating material is disposed over the substrate and then etched with a planar etch to expose the upper surface of the silicon layer 1828. Thereafter, a layer of heavy metal in the form of molybdenum (Mo) is deposited with a sputter deposition technique onto the upper surface of the partially fabricated substrate. Typically, the layer 1828 will have a thickness of approximately 5 microns with the layer of molybdenum 1832 having a thickness of approximately 1 micron. Once the metal layer 1832 is deposited, it is then patterned and etched to define the upper contact region.

Figure 47:
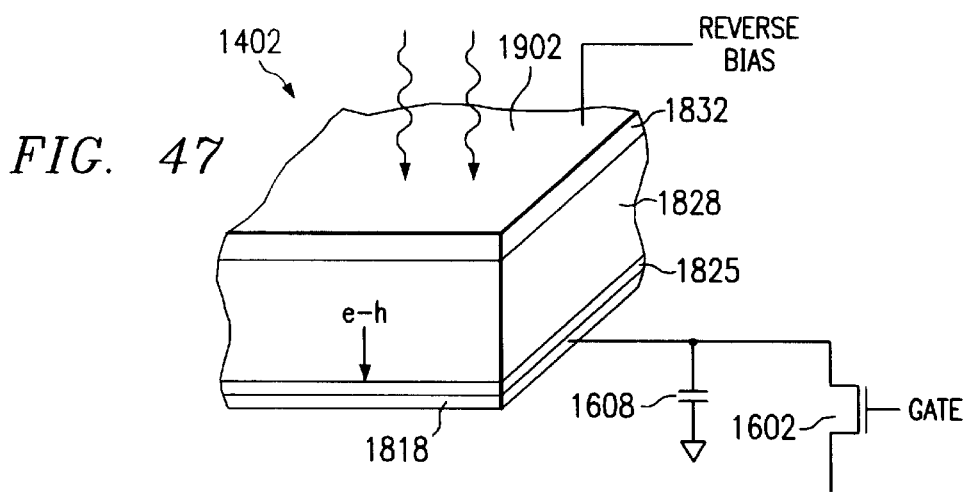
FIG. 47 illustrates a diagrammatic view of a single pixel in three dimensions.
Figure 48:
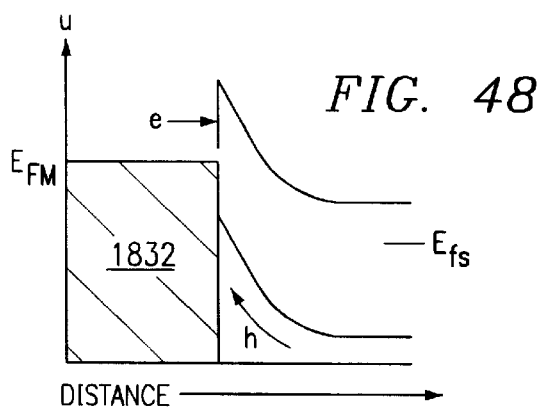
FIG. 48 illustrates a diagrammatic view of the energy levels at the interface for the Schotky diode.

Referring now to FIG. 47, there is illustrated a three-dimensional view of a pixel element 1402. This illustrates the overall structure where gamma rays impinging upon an upper surface 1902 of the metal layer 1832 will create electron hole pairs that are driven down to the metal lower contact 1818. It can be seen in the diagram of FIG. 48, that the holes move toward the metal whereas the electrons move away from the metal. This trapping of holes at the interface results in an increasing reverse current. The y-axis represents the energy whereas the x-axis represents the distance. The Fermi levels in the metal are illustrated by the $E_{FM}$ value and the Fermi level in the amorphous hydrogenated silicon is illustrated by the term $E_{fs}$.

Figure 49:
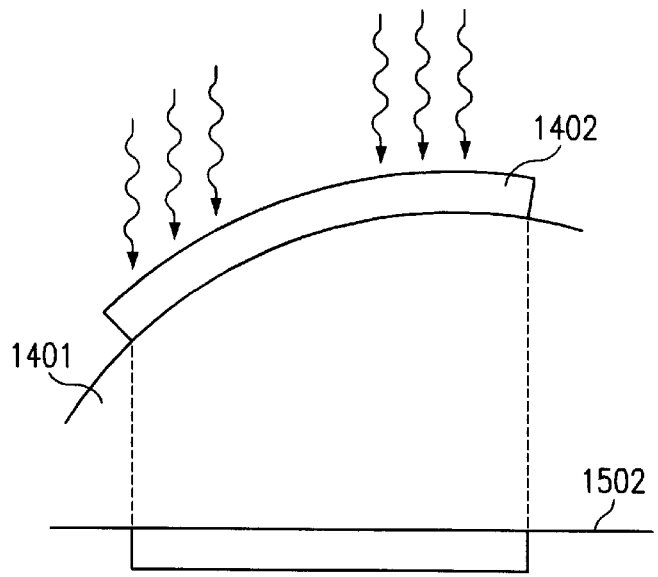
FIG. 49 illustrates a cross-sectional view of a portion of a spherical semiconductor detector.

Referring now to FIG. 49, there is illustrated a cross-sectional view of the center spherical IC 1401 with the pixel 1402 disposed on the upper surface thereof, illustrating the impinging gamma rays thereon. The pixel 1402, as noted hereinabove, is disposed on a spherical surface. Therefore, when it is projected down into the actual plane of impingement 1502, it possibly will have a different surface area on that plane 1502. This could result in aberrations in the output of each of the pixel 1402, as the output is a function of the amount of energy that will be impinged on the surface area. This situation will be exacerbated with respect to the lower layer spherical ICs, such as the center spherical IC 1401. If any portion of the exposed surface of the pixel 1402 is shadowed by a top spherical IC 1401, this could reduce the amount of energy associated therewith.

It should be noted that although the sensor modules 24 have been described for use in logging oil and gas wells, the sensor modules 24 may be used in other applications and with other sensors. Such other applications include circulating the sensor modules through piping systems, such as oil pipelines, gas pipelines, water pipelines, and pipes and flow passages in refineries, chemical and other processing plants, and the like. The sensor modules 24 may be pass through these various piping systems for use in monitoring flow systems, and for early detection of deteriorated components to prevent failures and reduce down time in such operations.

Although the preferred embodiment has been described in detail, it should be understood that various changes, substitutions and alterations can be made therein without departing from the spirit and scope of the invention as defined by the appended claims.

What is claimed is:

1. A method for sensing downhole measurement parameters in a well, comprising the steps of:

providing a plurality of sensor modules, each having a sensor section, a storage register and a power source which are encapsulated in a protective outer covering, and operative for sensing at least one desired parameter and storing a value therefor in a storage register;

injecting the plurality of the sensors modules into a flow line connected to the drill string;

pumping the sensor modules downhole, through a lower portion of the drill string and into an annulus defined between the drill string and a borehole of the well, detecting the desired parameter and storing the value therefor in the storage register; and passing the sensor modules to a read unit to read the value of the parameter stored in the storage register.

2. The method of claim 1, further comprising the step of providing a plurality of the sensor modules of various types for measuring respective ones of different parameters.

3. The method of claim 1, further comprising the step of exposing the sensor modules to an electromagnetic field disposed in a selected location, to activate the sensor modules to store the value for the selected parameter.

4. The method of claim 3, wherein exposing the sensor module to the electromagnetic field provides operative power to the sensor modules.

5. The method of claim 4, wherein operative power is only applied to the sensor module when disposed within the electromagnetic field.

6. The method of claim 5, wherein at least a portion of the plurality of the sensor modules only record one value for the parameter, and the respective value is stored in the respective storage register when operative power is removed from the sensor modules.

7. The method of claim 1, wherein the step of providing the sensor modules comprises forming each of the sensor section, the storage register and the power source on a single spherically shaped semiconductor substrate.

8. The method of claim 1, wherein the step of passing the sensor modules to a read unit and reading the value of the parameter stored in the storage register comprises emitting an electromagnetic control signal from the read unit to the sensor module, which, in response to the electromagnetic control signal, emits an electromagnetic data signal with the value of the parameter encoded on the electromagnetic data signal.

9. The method of claim 8, wherein the plurality of sensor modules includes sensor modules of various types for measuring different types of parameters and recording values therefor, and said sensor modules are responsive to respective ones of different electromagnetic control signals to emit respective electromagnetic data signals at the read unit.

\* \* \* \* \*